US012757619B2

(12) United States Patent
Kim et al.

(10) Patent No.: US 12,757,619 B2
(45) Date of Patent: Oct. 6, 2026

(54) ORGANIC LIGHT EMITTING DISPLAY APPARATUS WITH A LIGHT GUIDE MEMBER INCLUDING A PLURALITY OF LENSES WITH AN ATYPICAL ARRANGEMENT STRUCTURE

(71) Applicant: LG Display Co., Ltd., Seoul (KR)

(72) Inventors: SunWoong Kim, Paju-si (KR); JuHun Min, Paju-si (KR); SeungSoo Yang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 365 days.

(21) Appl. No.: 18/540,024

(22) Filed: Dec. 14, 2023

(65) Prior Publication Data

US 2024/0224762 A1 Jul. 4, 2024

(30) Foreign Application Priority Data

Dec. 30, 2022 (KR) ........................ 10-2022-0190561

(51) Int. Cl.
*H10K 59/80* (2023.01)
*H10K 59/124* (2023.01)

(52) U.S. Cl.
CPC ....... *H10K 59/8791* (2023.02); *H10K 59/124* (2023.02)

(58) Field of Classification Search
CPC .. H10K 59/879; H10K 59/8791; H10K 59/38; H10K 50/858; H10K 59/1201; H10K 2102/302; H10K 2102/311; H10K 50/11; H10K 50/868; H10K 59/12; H10K 59/124; H10K 59/8792
See application file for complete search history.

(56) References Cited

U.S. PATENT DOCUMENTS

| | | | | |
|---|---|---|---|---|
| 2005/0231447 A1* | 10/2005 | Hu | H10K 59/353 | 345/76 |
| 2010/0142185 A1* | 6/2010 | Wako | H10K 50/858 | 362/382 |
| 2010/0142189 A1* | 6/2010 | Hong | C09K 11/7739 | 362/97.3 |
| 2014/0118661 A1* | 5/2014 | Qi | G02F 1/133605 | 362/613 |
| 2014/0146561 A1* | 5/2014 | Yuki | G02B 6/0053 | 362/606 |
| 2015/0014660 A1 | 1/2015 | Lee | | |
| 2016/0291235 A1* | 10/2016 | Oh | G02B 6/00 | |

(Continued)

FOREIGN PATENT DOCUMENTS

| | | |
|---|---|---|
| KR | 10-2015-0008574 A | 1/2015 |
| KR | 10-2018-0003967 A | 1/2018 |

*Primary Examiner* — William B Partridge
*Assistant Examiner* — David Paul Sedorook
(74) *Attorney, Agent, or Firm* — Morgan, Lewis & Bockius LLP

(57) ABSTRACT

An organic light emitting display apparatus may provide a display panel including a light extracting portion having a curved portion, and a light emitting device layer on the light extracting portion. The organic light emitting display apparatus may further provide a light guide member on or below a light extraction surface of the display panel. The light guide member may include a plurality of light refraction patterns having an atypical arrangement structure, and a refractive layer on or below the plurality of light refraction patterns.

21 Claims, 9 Drawing Sheets

(56) References Cited

U.S. PATENT DOCUMENTS

| | | | | |
|---|---|---|---|---|
| 2021/0173137 | A1* | 6/2021 | Meng | G02F 1/133368 |
| 2022/0252899 | A1* | 8/2022 | Wu | G02B 27/0101 |
| 2023/0273362 | A1* | 8/2023 | Yagi | G02B 6/0076<br>362/606 |

* cited by examiner

ORGANIC LIGHT EMITTING DISPLAY APPARATUS WITH A LIGHT GUIDE MEMBER INCLUDING A PLURALITY OF LENSES WITH AN ATYPICAL ARRANGEMENT STRUCTURE

CROSS-REFERENCE TO RELATED APPLICATIONS

This application claims the benefit of and priority to Korean Patent Application No. 10-2022-0190561, filed on Dec. 30, 2022, the entirety of which is incorporated herein by reference for all purposes.

BACKGROUND

1. Technical Field

The present disclosure relates to a display apparatus and particularly to, for example, without limitation, a light emitting display apparatus capable of increasing internal light extraction efficiency and reducing reflectivity to external light, where the light emitting display apparatus may be an organic light emitting display apparatus.

2. Discussion of the Related Art

An organic light emitting display apparatus has a high response speed and has low power consumption. Unlike a liquid crystal display device, the organic light emitting display apparatus is a self-emissive display apparatus and does not require a separate light source. Thus, there is no problem in the viewing angle, whereby the organic light emitting display apparatus is subject to a next generation flat panel display apparatus.

The organic light emitting display apparatus may display an image through light emission of a light emitting device layer including an emission layer interposed between two electrodes.

However, since some of the light emitted from the emission layer is not emitted to the outside due to total reflection or the like at the interface between the emission layer and the electrode and/or total reflection at the interface between the substrate and the air layer, the light extraction efficiency is reduced. Accordingly, the organic light emitting display apparatus has problems in that brightness is reduced due to low light extraction efficiency, and power consumption is increased.

The description provided in the discussion of the related art section should not be assumed to be prior art merely because it is mentioned in or associated with that section. The discussion of the related art section may include information that describes one or more aspects of the subject technology, and the description in this section does not limit the invention.

SUMMARY

One or more aspects of the present disclosure are directed to providing an organic light emitting display apparatus that substantially obviates one or more problems due to limitations and disadvantages of the related art.

An aspect of the present disclosure is directed to providing an organic light emitting display apparatus that may enhance light extraction efficiency of light that is emitted from an emission layer.

Another aspect of the present disclosure is directed to providing an organic light emitting display apparatus including a light refraction pattern capable of improving a black color (or black rising) or a black visibility characteristic by a reflection of external light.

Another aspect of the present disclosure is directed to providing an organic light emitting display apparatus including a light refraction pattern capable of minimizing or reducing the occurrence of rainbow Mura and the occurrence of ring Mura by a reflection of external light.

Another aspect of the present disclosure is directed to providing an organic light emitting display apparatus capable of minimizing or reducing the occurrence of a sparkle phenomenon and a moire phenomenon by an interference between a light refraction pattern and a pixel.

The aspects of the present disclosure are not limited to the foregoing, and other aspects will be clearly understood by and apparent to those skilled in the art from the descriptions herein.

To achieve these and other aspects of the present disclosure, as embodied and broadly described herein, in one or more aspects, an organic light emitting display apparatus may comprise a display panel including a light extracting portion having a curved portion, and a light emitting device layer on or coupled to the light extracting portion; and a light guide member on or below a light extraction surface of the display panel. The light guide member may include a plurality of lens patterns having an atypical arrangement structure, and a refractive layer on or below the plurality of lens patterns.

In one or more aspects, an organic light emitting display apparatus may comprise a substrate, a plurality of subpixels having an emission area, a light extracting portion including a plurality of concave portions at the emission area, a light emitting device layer on the light extracting portion and configured to emit light to a light extraction surface, and a light guide member on or below the light extraction surface. The light guide member may include a plurality of light refraction patterns having an atypical arrangement structure, and a refractive layer on the plurality of light refraction patterns.

In one or more aspects, a light emitting display apparatus may comprise a light extracting portion, a light emitting device layer coupled to or overlapping the light extracting portion, and a light guide member overlapping the light emitting device layer and the light extracting portion. The light guide member may be configured to diffract or scatter light from the light emitting device layer or the light extracting portion. The light guide member may include a plurality of light refraction patterns having an irregular arrangement structure, and a refractive layer on or below the plurality of light refraction patterns.

Other details according to various examples and aspects of the present disclosure are included in the descriptions and drawings herein.

An organic light emitting display apparatus according to one or more example embodiments of the present disclosure may enhance the light extraction efficiency of light emitted from an emission layer, and thus, may implement high efficiency and high luminance to extend a lifetime of the emission layer and may decrease power consumption, thereby utilizing low power.

Moreover, in an organic light emitting display apparatus according to one or more example embodiments of the present disclosure, a black color (or black rising) and a black visibility characteristic caused by the reflection of external light may be reduced, and the occurrence of rainbow Mura and circular ring Mura may be minimized or reduced, thereby providing real black in a non-driving or off state.

Furthermore, in an organic light emitting display apparatus according to one or more example embodiments of the present disclosure, a sparkle phenomenon and a moire phenomenon caused by an interference between a light refraction pattern and a pixel may be minimized or reduced, an image quality may be improved and a visibility of viewer to an image may be improved.

Other systems, apparatuses, methods, features and advantages will be, or will become, apparent to one with skill in the art upon examination of the figures and detailed description herein. It is intended that all such additional systems, apparatuses, methods, features and advantages be included within this description, be within the scope of the present disclosure, and be protected by the following claims. Nothing in this section should be taken as a limitation on those claims. Further aspects and advantages are discussed below in conjunction with aspects of the disclosure.

It is to be understood that both the foregoing description and the following description of the present disclosure are examples and are intended to provide further explanation of the disclosure as claimed.

BRIEF DESCRIPTION OF THE DRAWINGS

The accompanying drawings, which are included to provide a further understanding of the disclosure, are incorporated in and constitute a part of this disclosure, illustrate aspects and embodiments of the disclosure, and together with the description serve to explain principles and examples of the disclosure.

Figure 1:
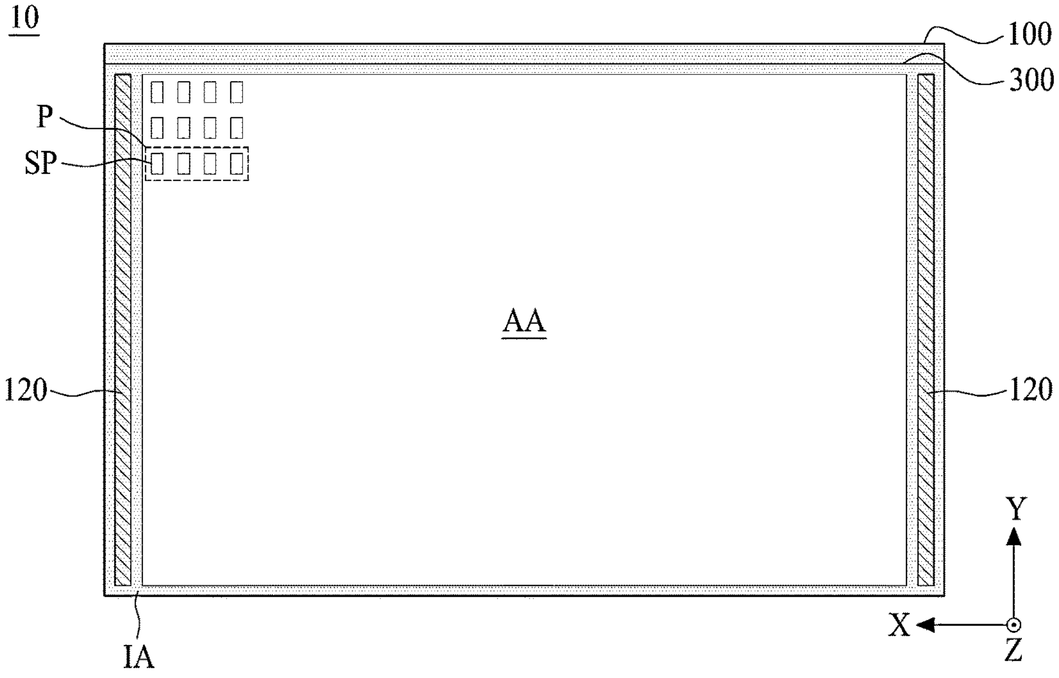
FIG. 1 is a diagram for describing an organic light emitting display apparatus according to an example embodiment of the present disclosure.

Throughout the drawings and the detailed description, unless otherwise described, the same drawing reference numerals should be understood to refer to the same elements, features, and structures. The sizes, lengths, and thicknesses of layers, regions and elements, and depiction thereof may be exaggerated for clarity, illustration, and convenience.

DETAILED DESCRIPTION

Reference is now made in detail to embodiments of the present disclosure, examples of which may be illustrated in the accompanying drawings. In the following description, when a detailed description of well-known methods, functions, structures or configurations may unnecessarily obscure aspects of the present disclosure, the detailed description thereof may have been omitted for brevity. Further, repetitive descriptions may be omitted for brevity. The progression of processing steps and/or operations described is a non-limiting example.

The sequence of steps and/or operations is not limited to that set forth herein and may be changed to occur in an order that is different from an order described herein, with the exception of steps and/or operations necessarily occurring in a particular order. In one or more examples, two operations in succession may be performed substantially concurrently, or the two operations may be performed in a reverse order or in a different order depending on a function or operation involved.

Unless stated otherwise, like reference numerals may refer to like elements throughout even when they are shown in different drawings. In one or more aspects, identical elements (or elements with identical names) in different drawings may have the same or substantially the same functions and properties unless stated otherwise. Names of the respective elements used in the following explanations are selected only for convenience and may be thus different from those used in actual products.

Advantages and features of the present disclosure, and implementation methods thereof, are clarified through the embodiments described with reference to the accompanying drawings. The present disclosure may, however, be embodied in different forms and should not be construed as limited to the embodiments set forth herein. Rather, these embodiments are examples and are provided so that this disclosure may be thorough and complete to assist those skilled in the art to understand the inventive concepts without limiting the protected scope of the present disclosure.

Shapes, dimensions (e.g., sizes, lengths, widths, heights, thicknesses, locations, radii, diameters, and areas), proportions, ratios, angles, numbers, the number of elements, and the like disclosed herein, including those illustrated in the drawings, are merely examples, and thus, the present disclosure is not limited to the illustrated details. It is, however, noted that the relative dimensions of the components illustrated in the drawings are part of the present disclosure.

When the term “comprise,” “have,” “include,” “contain,” “constitute,” “made of,” “formed of,” “composed of,” or the like is used with respect to one or more elements, one or more other elements may be added unless a term such as “only” or the like is used. The terms used in the present disclosure are merely used in order to describe particular example embodiments, and are not intended to limit the scope of the present disclosure. The terms of a singular form may include plural forms unless the context clearly indicates otherwise. The word “exemplary” is used to mean serving as an example or illustration. Embodiments are example embodiments. Aspects are example aspects. “Embodiments,” “examples,” “aspects,” and the like should not be construed to be preferred or advantageous over other implementations. An embodiment, an example, an example embodiment, an aspect, or the like may refer to one or more embodiments, one or more examples, one or more example embodiments, one or more aspects, or the like, unless stated otherwise. Further, the term “may” encompasses all the meanings of the term “can.”

In one or more aspects, unless explicitly stated otherwise, an element, feature, or corresponding information (e.g., a level, range, dimension, size, or the like) is construed to include an error or tolerance range even where no explicit description of such an error or tolerance range is provided. An error or tolerance range may be caused by various factors (e.g., process factors, internal or external impact, noise, or the like). In interpreting a numerical value, the value is interpreted as including an error range unless explicitly stated otherwise.

In describing a positional relationship, where the positional relationship between two elements (e.g., layers, films, regions, components, sections, or the like) is described, for example, using “on,” “upon,” “on top of,” “over,” “under,” “above,” “below,” “beneath,” “near,” “close to,” “adjacent to,” “beside,” “next to,” “at or on a side of” or the like, one or more other elements may be located between the two elements unless a more limiting term, such as “immediate(ly),” “direct(ly),” or “close(ly),” is used. For example, when an element is described as being positioned “on,” “on a top of,” “upon,” “on top of,” “over,” “under,” “above,” “below,” “beneath,” “near,” “close to,” “adjacent to,” “beside,” “next to,” or “at or on a side of” another element, this description should be construed as including a case in which the elements contact each other directly as well as a case in which one or more additional elements are disposed or interposed therebetween. Furthermore, the terms “front,” “rear,” “back,” “left,” “right,” “top,” “bottom,” “downward,” “upward,” “upper,” “lower,” “up,” “down,” “column,” “row,” “vertical,” “horizontal,” and the like refer to an arbitrary frame of reference.

Spatially relative terms, such as “below,” “beneath,” “lower,” “on,” “above,” “upper” and the like, can be used to describe a correlation between various elements (e.g., layers, films, regions, components, sections, or the like) as shown in the drawings. The spatially relative terms are to be understood as terms including different orientations of the elements in use or in operation in addition to the orientation depicted in the drawings. For example, if the elements shown in the drawings are turned over, elements described as “below” or “beneath” other elements would be oriented “above” other elements. In one or more aspects, the term “below” or the like, which is an example term, can include all directions, including directions of “above” and “below” and diagonal directions. Likewise, an exemplary term “above,” “on” or the like can include all directions, including directions of “above” and “below” and diagonal directions.

In describing a temporal relationship, when the temporal order is described as, for example, “after,” “subsequent,” “next,” “before,” “preceding,” “prior to,” or the like, a case that is not consecutive or not sequential may be included and thus one or more other events may occur therebetween, unless a more limiting term, such as “just,” “immediate(ly),” or “direct(ly),” is used.

It is understood that, although the terms “first,” “second,” and the like may be used herein to describe various elements (e.g., layers, films, regions, components, sections, or the like), these elements should not be limited by these terms, for example, to any particular order, precedence, or number of elements. These terms are used only to distinguish one element from another. For example, a first element could be a second element, and, similarly, a second element could be a first element, without departing from the scope of the present disclosure. Furthermore, the first element, the second element, and the like may be arbitrarily named according to the convenience of those skilled in the art without departing from the scope of the present disclosure. For clarity, the functions or structures of these elements (e.g., the first element, the second element, and the like) are not limited by ordinal numbers or the names in front of the elements. Further, a first element may include one or more first elements. Similarly, a second element or the like may include one or more second elements or the like.

In describing elements of the present disclosure, the terms “first,” “second,” “A,” “B,” “(a),” “(b),” or the like may be used. These terms are intended to identify the corresponding element(s) from the other element(s), and these are not used to define the essence, basis, order, or number of the elements.

For the expression that an element (e.g., layer, film, region, component, section, or the like) is “connected,” “coupled,” “attached,” “adhered,” or the like to another element, the element can not only be directly connected, coupled, attached, adhered, or the like to another element, but also be indirectly connected, coupled, attached, adhered, or the like to another element with one or more intervening elements disposed or interposed between the elements, unless otherwise specified.

For the expression that an element (e.g., layer, film, region, component, section, or the like) “contacts,” “overlaps,” or the like with another element, the element can not only directly contact, overlap, or the like with another element, but also indirectly contact, overlap, or the like with another element with one or more intervening elements disposed or interposed between the elements, unless otherwise specified.

The phase that an element (e.g., layer, film, region, component, section, or the like) is “provided,” “disposed,” “connected,” “coupled,” or the like in, on, with or to another element may be understood, for example, as that at least a portion of the element is provided, disposed, connected, coupled, or the like in, on, with or to at least a portion of another element. The phrase “through” may be understood, for example, to be at least partially through or entirely through. The phase that an element (e.g., layer, film, region, component, section, or the like) “contacts,” “overlaps,” or the like with another element may be understood, for example, as that at least a portion of the element contacts, overlaps, or the like with a least a portion of another element.

The terms such as a "line" or "direction" should not be interpreted only based on a geometrical relationship in which the respective lines or directions are parallel or perpendicular to each other, and may be meant as lines or directions having wider directivities within the range within which the components of the present disclosure can operate functionally. For example, the terms "first direction," "second direction," and the like, such as the terms "direction X," "direction Y," "direction Z," and "diagonal direction" should not be interpreted only based on a geometrical relationship in which the respective directions are parallel or perpendicular to each other, and may be meant as directions having wider directivities within the range within which the components of the present disclosure can operate functionally. In one or more aspects, the directions X, Y and Z may be interchanged.

The term "at least one" should be understood as including any and all combinations of one or more of the associated listed items. For example, each of the phrases "at least one of a first item, a second item, or a third item" and "at least one of a first item, a second item, and a third item" may represent (i) a combination of items provided by two or more of the first item, the second item, and the third item or (ii) only one of the first item, the second item, or the third item. Further, at least one of a plurality of elements can represent (i) one element of the plurality of elements, (ii) some elements of the plurality of elements, or (iii) all elements of the plurality of elements. Further, "at least some," "some," "some elements," "a portion," "portions," "at least a portion," "at least portions," "a part," "at least a part," "parts," "at least parts," "one or more," or the like of the plurality of elements can represent (i) one element of the plurality of elements, (ii) a part of the plurality of elements, (iii) parts of the plurality of elements, (iv) multiple elements of the plurality of elements, or (v) all of the plurality of elements. Moreover, at least a portion (or a part) of an element can represent (i) a portion (or a part) of the element, (ii) one or more portions (or parts) of the element, or (iii) the element, or the entirety of the element. A phrase that a plurality of first elements are connected to a plurality of second elements may describe, for example, that at least a part (or one or more first elements) of a plurality of first elements are connected to at least a part (or one or more second elements) of a plurality of second elements.

The expression of a first element, a second elements "and/or" a third element should be understood as one of the first, second and third elements or as any or all combinations of the first, second and third elements. By way of example, A, B and/or C may refer to only A; only B; only C; any of A, B, and C (e.g., A, B, or C); some combination of A, B, and C (e.g., A and B; A and C; or B and C); or all of A, B, and C. Furthermore, an expression "A/B" may be understood as A and/or B. For example, an expression "A/B" may refer to only A; only B; A or B; or A and B.

In one or more aspects, the terms "between" and "among" may be used interchangeably simply for convenience unless stated otherwise. For example, an expression "between a plurality of elements" may be understood as among a plurality of elements. In another example, an expression "among a plurality of elements" may be understood as between a plurality of elements. In one or more examples, the number of elements may be two. In one or more examples, the number of elements may be more than two. Furthermore, when an element (e.g., layer, film, region, component, section, or the like) is referred to as being "between" at least two elements, the element may be the only element between the at least two elements, or one or more intervening elements may also be present.

In one or more aspects, the phrases "each other" and "one another" may be used interchangeably simply for convenience unless stated otherwise. For example, an expression "different from each other" may be understood as being different from one another. In another example, an expression "different from one another" may be understood as being different from each other. In one or more examples, the number of elements involved in the foregoing expression may be two. In one or more examples, the number of elements involved in the foregoing expression may be more than two.

In one or more aspects, the phrases "one or more among" and "one or more of" may be used interchangeably simply for convenience unless stated otherwise. In one or more aspects, unless stated otherwise, the term "nth" may refer to "nnd" (e.g., 2nd where n is 2), or "nrd" (e.g., 3rd where n is 3), and n may be a natural number.

The term "or" means "inclusive or" rather than "exclusive or." That is, unless otherwise stated or clear from the context, the expression that "x uses a or b" means any one of natural inclusive permutations. For example, "a or b" may mean "a," "b," or "a and b." For example, "a, b or c" may mean "a," "b," "c," "a and b," "b and c," "a and c," or "a, b and c."

Features of various embodiments of the present disclosure may be partially or entirely coupled to or combined with each other, may be technically associated with each other, and may be variously operated, linked or driven together in various ways. Embodiments of the present disclosure may be implemented or carried out independently of each other or may be implemented or carried out together in a co-dependent or related relationship. In one or more aspects, the components of each apparatus and device according to various embodiments of the present disclosure are operatively coupled and configured.

Unless otherwise defined, the terms (including technical and scientific terms) used herein have the same meaning as commonly understood by one of ordinary skill in the art to which example embodiments belong. It is further understood that terms, such as those defined in commonly used dictionaries, should be interpreted as having a meaning that is, for example, consistent with their meaning in the context of the relevant art and should not be interpreted in an idealized or overly formal sense unless expressly defined otherwise herein.

The terms used herein have been selected as being general in the related technical field; however, there may be other terms depending on the development and/or change of technology, convention, preference of technicians, and so on. Therefore, the terms used herein should not be understood as limiting technical ideas, but should be understood as examples of the terms for describing example embodiments.

Further, in a specific case, a term may be arbitrarily selected by an applicant, and in this case, the detailed meaning thereof is described herein. Therefore, the terms used herein should be understood based on not only the name of the terms, but also the meaning of the terms and the content hereof.

In the following description, various example embodiments of the present disclosure are described in detail with reference to the accompanying drawings. With respect to reference numerals to elements of each of the drawings, the same elements may be illustrated in other drawings, and like reference numerals may refer to like elements unless stated otherwise. The same or similar elements may be denoted by the same reference numerals even though they are depicted in different drawings. In addition, for convenience of description, a scale, dimension, size, and thickness of each of the elements illustrated in the accompanying drawings may be different from an actual scale, dimension, size, and thickness, and thus, embodiments of the present disclosure are not limited to a scale, dimension, size, and thickness illustrated in the drawings.

FIG. 1 is a diagram for describing an organic light emitting display apparatus according to an example embodiment of the present disclosure.

Referring to FIG. 1, the organic light emitting display apparatus according to an example embodiment of the present disclosure may comprise a display panel 10 including a substrate 100 and a counter substrate 300 bonded to each other.

The display panel 10 includes a thin film transistor, and the substrate 100 may be a transparent glass substrate or a transparent plastic substrate. The display panel 10 may include (or may be divided into) a display area AA and a non-display area IA. The substrate 100 may include (or may be divided into) the display area AA and the non-display area IA.

The display area AA is an area for displaying an image. The display area AA may be a pixel array area, an active area, a pixel array portion, or a screen. The display area AA may include a plurality of pixels P.

The plurality of pixels P may be disposed along a first direction X and a second direction Y crossing the first direction X. The plurality of pixels P may each be defined as a unit area from which light is actually emitted. For example, the plurality of pixels P may be arranged to have a pixel pitch PP along the first direction X. For example, the pixel pitch PP may be the size of each of the plurality of pixels P with respect to the first direction X, the distance between one side of each of the two adjacent pixels P along the first direction X, or the distance between center portions of the two adjacent pixels P along the first direction X.

Each of the plurality of pixels P may include a plurality of adjacent subpixels SP. For example, the plurality of subpixels SP may constitute the plurality of pixels P. For example, the first direction X may be a first lengthwise direction, a long-side lengthwise direction, a widthwise direction, or a first horizontal direction of the substrate 100. The second direction Y may be a second lengthwise direction, a short-side lengthwise direction, a lengthwise direction, a second horizontal direction, or a vertical direction of the substrate 100.

The non-display area IA is an area in which an image is not displayed. The non-display area IA may be a peripheral circuit area, a signal supply area, a non-active area, or a bezel area. The non-display area IA may be configured to surround the display area AA. The display panel 10 or substrate 100 may further include a peripheral circuit portion 120 disposed at the non-display area IA. The peripheral circuit portion 120 may include a gate driving circuit connected with a plurality of subpixels SP.

The counter substrate (or opposite substrate) 300 may be configured to overlap the display area AA. The counter substrate 300 may be disposed to be opposite-bonded to the substrate 100 by an adhesive member (or a transparent adhesive), or may be provided as a type where an organic material or an inorganic material is stacked on the substrate 100. The counter substrate 300 may be an upper substrate, a second substrate, or an encapsulation substrate and may correspond to encapsulating the substrate 100.

Figure 2:
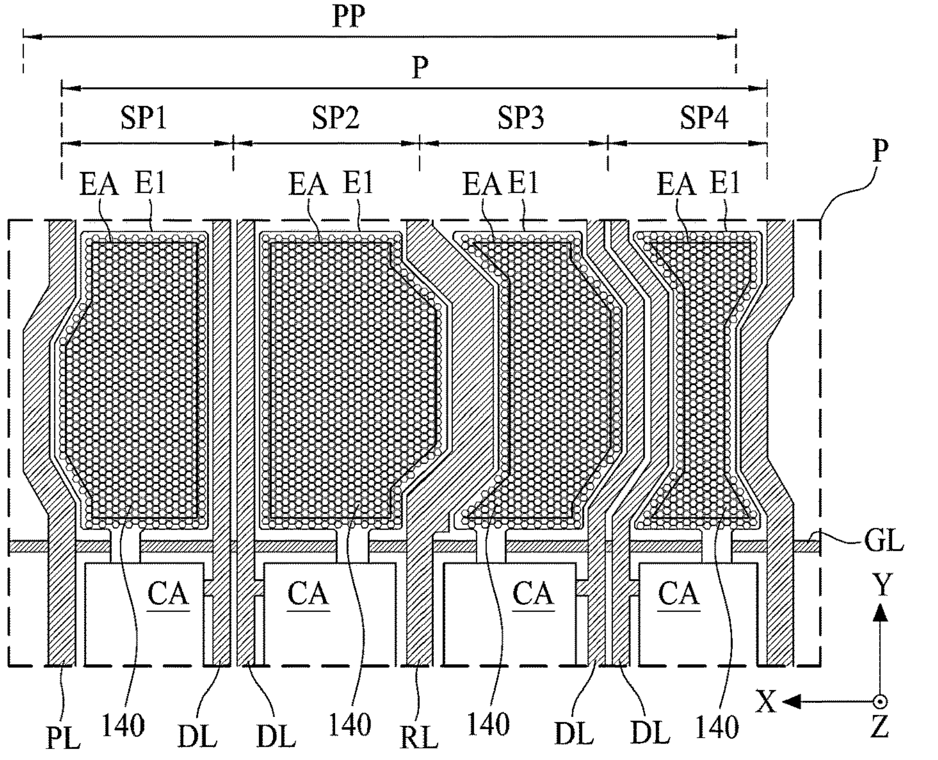
FIG. 2 is a plan view illustrating an example of a plan structure of a pixel shown in FIG. 1.

FIG. 2 is a plan view illustrating an example of a plan structure of a pixel shown in FIG. 1.

Referring to FIGS. 1 and 2, in the organic light emitting display apparatus or the display panel 10 according to an example embodiment of the present disclosure, each of the plurality of pixel P may include four subpixels SP1, SP2, SP3, and SP4.

Each of the plurality of pixel P according to an example embodiment may include first to fourth subpixels SP1, SP2, SP3, and SP4 adjacent to each other along the first direction X. For example, each of the plurality of pixels P may include a first subpixel SP1 of red, a second subpixel SP2 of white, a third subpixel SP3 of green, and a fourth subpixel SP4 of blue, but embodiments according to present disclosure are not limited thereto. Each of the first to fourth subpixels SP1, SP2, SP3, and SP4 may be configured to have different sizes (or areas) from each other.

Each of the first to fourth subpixels SP1, SP2, SP3, and SP4 may include an emission area EA and a circuit area CA.

The emission area EA may be disposed on one side (or an upper side) of the subpixel area. The emission area EA of each of the first to fourth subpixels SP1, SP2, SP3, and SP4 may have different sizes (or areas) from each other. For example, the emission area EA may be an opening region or a light emitting region.

The emission area EA of each of the first to fourth subpixels SP1, SP2, SP3, and SP4 may have different sizes (or areas) from each other along the first direction X. According to an example embodiment of the present disclosure, in the emission area EA of each of the first to fourth subpixels SP1, SP2, SP3, and SP4, the emission area EA of the second subpixel SP2 may have the largest size, the emission area EA of the fourth subpixel SP4 may have the smallest size, the emission area EA of the first subpixel SP1 may be a smaller than the emission area EA of the second subpixel SP2, and the emission area EA of the first subpixel SP1 may be a larger than the emission area EA of each of the third and fourth subpixels SP3 and SP4. Moreover, the emission area EA of the third subpixel SP3 may have a larger size than the emission area EA of the fourth subpixel SP4. However, embodiments according to present disclosure are not limited thereto.

The circuit area CA of each of the first to fourth subpixels SP1, SP2, SP3, and SP4 may be spatially separated from the emission area EA within the subpixel area SPA. For example, the circuit area CA may be disposed at the other side (or a lower side) of the subpixel area SPA, but embodiments according to present disclosure are not limited thereto. For example, at least a portion of the circuit area CA may overlap the emission area EA within the subpixel area SPA. For example, the circuit area CA may overlap an entire emission area EA within the subpixel area SPA or may be disposed below (or under) the emission area EA within the subpixel area SPA. For example, the circuit area CA may be a non-emission area or a non-opening region.

Each of the plurality of pixel P according to another example embodiment may further include a light transmitting portion (or a transparent portion) disposed around at least one of the emission area EA and the circuit area CA of each of the first to fourth subpixels SP1, SP2, SP3, and SP4. For example, each of the plurality of pixel P may include an emission area for subpixel corresponding to each of the plurality of subpixels SP1, SP2, SP3, and SP4, and the light transmitting portion (or a transparent portion) disposed around each of the plurality of subpixels SP1, SP2, SP3, and SP4, in this case, the organic light emitting display apparatus may implement a transparent light emitting display apparatus due to light transmission of the light transmitting portion.

Two data lines DL extending in parallel to each other along the second direction Y may be disposed between the first subpixel SP1 and the second subpixel SP2 and between the third subpixel SP3 and the fourth subpixel SP4, respectively. A gate line GL extending along the first direction X may be disposed between the emission area EA and the circuit area CA in each of the first to fourth subpixels SP1, SP2, SP3, and SP4. A pixel power line PL extending along the second direction Y may be disposed at one side of the first subpixel SP1 or the fourth subpixel SP4. A reference line RL extending along the second direction Y may be disposed between the second subpixel SP2 and the third subpixel SP3. The reference line RL may be used as a sensing line for externally sensing a variation in characteristics of a driving thin film transistor disposed in the circuit area CA of the pixel P and/or a variation in characteristics of a light emitting device layer disposed at the circuit area CA in a sensing driving mode of the pixel P.

Figure 3:
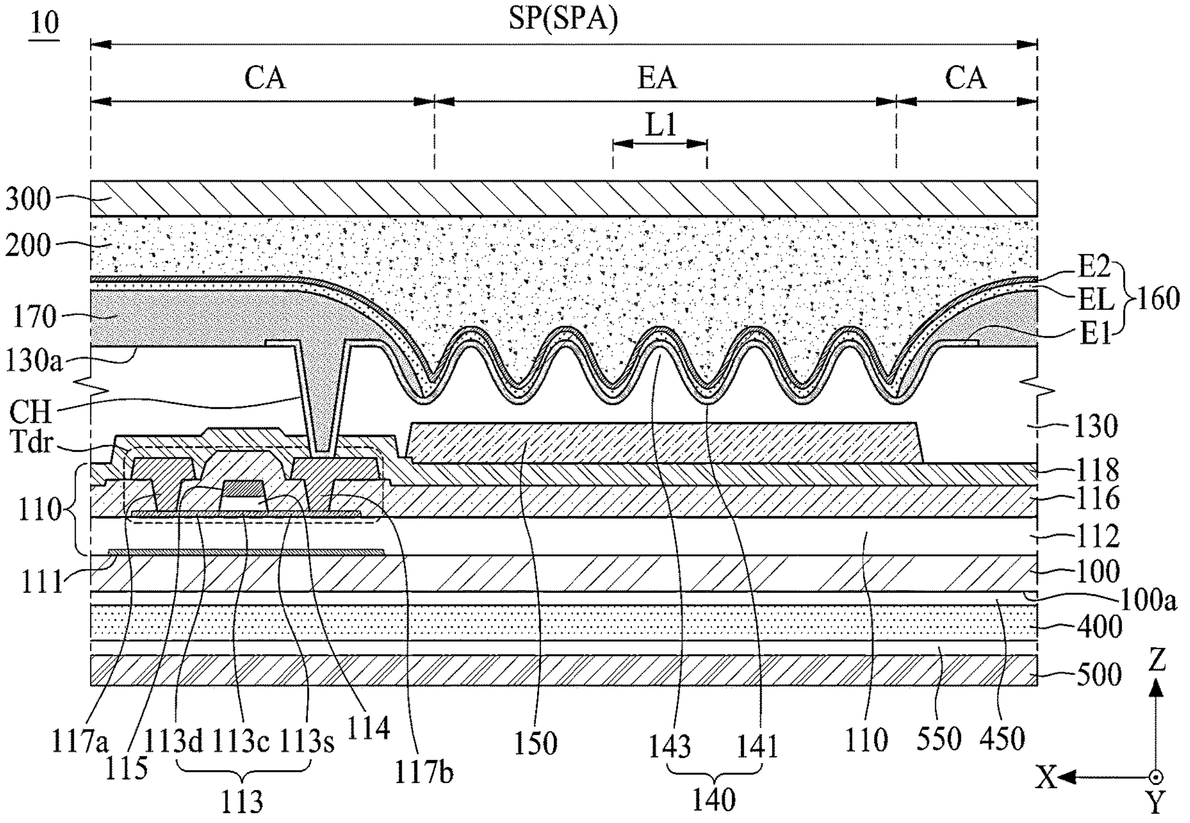
FIG. 3 is a cross-sectional view illustrating a cross-sectional structure of one subpixel according to an example embodiment of the present disclosure.

FIG. 3 is a cross-sectional view illustrating a cross-sectional structure of one subpixel according to an example embodiment of the present disclosure.

Referring to FIGS. 2 and 3, the organic light emitting display apparatus, according to an example embodiment of the present disclosure may comprise a substrate 100, an encapsulation portion 200, and a counter substrate 300. For example, the organic light emitting display apparatus or the display panel 10 according to an example embodiment of the present disclosure may comprise a substrate 100, an encapsulation portion 200, and a counter substrate 300.

The display panel 10 or the substrate 100 may include a thin film transistor, and the substrate 100 may be a first substrate, a base substrate, a lower substrate, a transparent glass substrate, a transparent plastic substrate, or a base member.

The display panel 10 or the substrate 100 may include a pixel circuit layer 110, a planarization layer 130, and a light emitting device layer 160. The pixel circuit layer 110 may include a buffer layer 112, a pixel circuit, and a protection layer 118.

The buffer layer 112 may be disposed at an entirety of a first surface (or a front surface) of the substrate 100. The buffer layer 112 may prevent or at least reduce materials contained in the substrate 100 from spreading to a transistor layer during a high-temperature process in the manufacturing of the thin film transistor, or may prevent external water or moisture from permeating into the light emitting device layer 160. Optionally, depending on the case, the buffer layer 112 may be omitted.

The pixel circuit may include a driving thin film transistor Tdr disposed at a circuit area CA of each subpixel SP (or each subpixel areas SPA). The driving thin film transistor Tdr may include an active layer 113, a gate insulating layer 114, a gate electrode 115, an interlayer insulating layer 116, a drain electrode 117*a*, and a source electrode 117*b*.

The active layer 113 may be configured with a semiconductor material based on any one of amorphous silicon, polycrystalline silicon, oxide, and organic materials. The active layer 113 may include a channel region 113*c*, a drain region 113*d*, and a source region 113*s*.

The gate insulating layer 114 may be formed of an island shape over the channel region 113*c* of the active layer 113, or may be formed over the entire front surface of the buffer layer 112 or substrate 100 including the active layer 113.

The gate electrode 115 may be disposed over the gate insulating layer 114 to overlap a channel region 113*c* of an active layer 113.

The interlayer insulating layer 116 may be formed over the gate electrode 115, and a drain region 113*d* and a source region 113*s* of the active layer 113. The interlayer insulating layer 116 may be formed at an entire front surface of the buffer layer 112 or substrate 100. For example, the interlayer insulating layer 116 may include an inorganic material or an organic material.

The drain electrode 117*a* may be disposed over the interlayer insulating layer 116 to be electrically connected to the drain region 113*d* of the active layer 113. The source electrode 117*b* may be disposed over the interlayer insulating layer 116 to be electrically connected to the source region 113*s* of the active layer 113.

The pixel circuit may further include at least one capacitor and at least one switching thin film transistors which are disposed at the circuit area CA together with the driving thin film transistor Tdr.

The organic light emitting display apparatus according to an example embodiment of the present disclosure may further include a light shielding layer 111 provided below (or under) at least one active layer 113 of the driving thin film transistor Tdr, a first switching thin film transistor, and a second switching thin film transistor. The light shielding layer 111 may be configured to reduce or prevent a change in a threshold voltage of the thin film transistor caused by external light.

The protection layer 118 may be configured over the pixel circuit. For example, the protection layer 118 may be configured to surround the drain electrode 117*a* and the source electrode 117*b* of the driving thin film transistor Tdr and the interlayer insulating layer 116. For example, the protection layer 118 may be formed of an inorganic insulating material and may be expressed in terms such as a passivation layer.

The planarization layer 130 may be provided over the pixel circuit layer 110. The planarization layer 130 may be formed at the entire display area AA and the remaining portions of the non-display area IA except the pad area. For example, the planarization layer 130 may include an extension portion (or expansion portion) extended or expanded from the display area AA to the remaining portions of the non-display area IA except the pad area. Accordingly, the planarization layer 130 may have a relatively large size than the display area AA.

The planarization layer 130 according to an example embodiment may be formed to have a relatively large thickness so that the planarization layer 130 may provide a planarized surface 130*a* over the pixel circuit layer 110. For example, the planarization layer 130 may be formed of an organic material such as one of photo acrylic, benzocyclobutene, polyimide, and fluorine resin, or the like.

The planarization layer 130 may include a light extraction portion 140 disposed at each subpixel SP. According to an example embodiment of the present disclosure, the light extraction portion 140 may be formed at the planarization layer 130 to overlap the emission area EA defined in the subpixel area SPA of each subpixel SP. According to another example embodiment, the light extraction portion 140 may be formed at an entire planarization layer 130.

The light extraction portion 140 may be formed at the planarization layer 130 to have a curved portion (or non-flat portion). The light extraction portion 140 may be formed at the planarization layer 130 to have a curved shape (or an uneven shape). The light extraction portion 140 may have a size larger than the emission area EA. For example, the light extraction portion 140 may be a curved pattern portion, an uneven pattern portion, a micro lens, or a light scattering portion.

The light extraction portion 140 according to an example embodiment may include a plurality of concave portions 141, and a convex portion 143 disposed around each of the plurality of concave portions 141.

Each of the plurality of concave portions 141 may be implemented to be concave from the upper surface (or a flat surface) 130*a* of the planarization layer 130. The plurality of concave portions 141 may have a same height with respect to the upper surface 130*a* of the planarization layer 130, but some of the plurality of concave portions 141 may have different depths. For example, a bottom surface of each of the plurality of concave portions 141 may be positioned between the upper surface 130*a* of the planarization layer 130 and the substrate 100.

Each of the plurality of concave portions 141 may be disposed in parallel to have a predetermined interval along a second direction Y and may be arranged to be staggered with one another along the second direction Y. For example, the plurality of concave portions 141 disposed along the second direction Y may be positioned or aligned at a zigzag line ZL having a zigzag shape along the first direction X (or the second direction Y). Thus, the light extraction portion 140 may include a larger number of concave portions 141 per unit area, thereby increasing the external extraction efficiency of the light emitted from the light emitting device layer 160.

According to an example embodiment of the present disclosure, a center portion of each of the adjacent three concave portions 141 may be aligned to form a triangular shape. In addition, the center portion of each of the six concave portions 141 disposed around one concave portion 141 or surrounding one concave portion 141 may have a 6-angular shape HS in two-dimensions (or in a plan view). For example, each of the plurality of concave portions 141 may be disposed or arranged in a honeycomb structure, a hexagonal structure, or a circular structure in two-dimensions (or in a plan view).

According to an example embodiment of the present disclosure, a pitch (or a distance) L1 between the plurality of concave portions 141 disposed at each of the plurality of subpixels SP configuring the one pixel may be equal or different from each other. The pitch L1 between the plurality of concave portions 141 may be a distance (or an interval) between the center portions of the two adjacent concave portions 141.

The convex portion 143 may be formed to be connected to each other between the plurality of concave portions 141. The convex portion 143 may be formed to surround each of the plurality of concave portions 141. For example, the convex portion 143 may be configured to individually surround each of the plurality of concave portions 141. Accordingly, the planarization layer 130 overlapping the emission area EA may include a plurality of concave portions 141 surrounded by the convex portions 143. For example, the convex portion 143 surrounding one concave portion 141 may have a square shape, a honeycomb shape, or a circle shape in two-dimensions (or in a plan view) according to the arrangement structure of each of the plurality of concave portions 141.

The convex portion 143 may be provided at the planarization layer 130 that overlaps the emission area EA to have a shape that may maximize an external extraction efficiency of light generated from the subpixel SP based on an effective emission area of the light emitting device layer 160. The convex portion 143 may change a propagation path of light emitted from the light emitting device layer 160 toward the light extraction surface and extracts the light totally reflected within the light emitting device layer 160 toward the light extraction surface, and thus, degradation of the light extraction efficiency caused by the light which is trapped within the light emitting device layer 160 may be prevented or minimized.

A top portion of the convex portion 143 according to an example embodiment may be adjacent to the light emitting device layer 160 and may have a sharp structure and a convex curved shape, so as to increase the light extraction efficiency. For example, the top portion of the convex portion 143 may include a dome or bell structure having a convex cross-sectional shape. For example, the convex portions 143 may be defined at boundary portion portions between adjacent light extraction portion 140. While not shown, the convex portions 143 may have a curved shape so that the adjacent light extraction portion 140 have a surface with a wave shape.

The convex portion 143 according to an example embodiment may include an inclined portion having a curved shape between a bottom portion and the top portion (or peak portion). The inclined portion of the convex portion 143 may form or configure the concave portion 141. For example, the inclined portion of the convex portion 143 may be an inclined surface or a curved portion. The inclined portion of the convex portion 143 according to an example embodiment may have a cross-sectional structure having Gaussian curve. In this case, the inclined portion of the convex portion 143 may have a tangent slope which increases progressively from the bottom portion to the top portion, and then decreases progressively.

The light emitting device layer 160 may be disposed on (or over) the light extraction portion 140 overlapping the emission area EA of each subpixel SP. The light emitting device layer 160 according to an example embodiment may include a first electrode E1, an emission layer EL, and a second electrode E2. For example, the first electrode E1, the emission layer EL, and the second electrode E2 may be configured to emit the light toward the substrate 100 according to a bottom emission type.

The first electrode E1 may be formed on (or over) the planarization layer 130 of the subpixel area SPA, and may be electrically connected to a source electrode 117*b* (or a drain electrode 117*a*) of the driving thin film transistor Tdr. One end of the first electrode E1 which is close to the circuit area CA may be electrically connected to the source electrode 117*b* (or a drain electrode 117*a*) of the driving thin film transistor Tdr via an electrode contact hole CH provided at the planarization layer 130 and the protection layer 118.

The first electrode E1 directly contacts the light extraction portion 140 and thus, may have a shape conforming to the shape of the light extraction portion 140. As the first electrode E1 is formed (or deposited) over the planarization layer 130 to have a relatively small thickness, the first electrode E1 may have a surface morphology (or a second surface morphology) conforming to a surface morphology (or a first surface morphology) of the light extraction portion 140 including the convex portion 143 and the plurality of concave portions 141. For example, the first electrode E1 is formed in a conformal shape based on the surface shape (morphology) of the light extraction portion 140 by a deposition process of a transparent conductive material, whereby the first electrode E1 may have a cross-sectional structure whose shape is same as the light extraction portion 140.

The emission layer EL may be formed on (or over) the first electrode E1 and may directly contact the first electrode E1. As the emission layer EL is formed (or deposited) on (or over) the first electrode E1 to have a relatively large thickness in comparison to the first electrode E1, the emission layer EL may have a surface morphology (or third surface morphology) which is different from the surface morphology in each of the plurality of concave portions 141 and the convex portion 143 or the surface morphology of the first electrode E1. For example, the emission layer EL may be formed in a non-conformal shape which does not conform to the surface shape (or morphology) of the first electrode E1 by a deposition process, whereby the emission layer EL may have a cross-sectional structure whose shape may be different from the first electrode E1.

The emission layer EL according to an example embodiment has a thickness that gradually increases toward the bottom surface of the convex portion 143 or the concave portion 141. For example, the emission layer EL may have the thinnest thickness at the inclined surface (or curved surface) between the convex portion 143 and the concave portion 141, but embodiments according to present disclosure are not limited thereto.

The emission layer EL according to an example embodiment includes two or more organic emission layers to emit white light. As an example, the emission layer EL may include a first organic emission layer and a second organic emission layer to emit white light by mixing a first light and a second light.

The second electrode E2 may be formed on (or over) the emission layer EL and may directly contact the emission layer EL. The second electrode E2 may be formed (or deposited) on (or over) the emission layer EL to have a relatively thin thickness compared to the emission layer EL. The second electrode E2 may be formed (or deposited) on (or over) the emission layer EL to have a relatively thin thickness, and thus may have a surface morphology corresponding to the surface morphology of the emission layer EL. For example, the second electrode E2 may be formed in a conformal shape corresponding to the surface shape (or morphology) of the emission layer EL by a deposition process, whereby the second electrode E2 may have a same cross-sectional structure as the emission layer EL and may have a cross-sectional structure whose shape may be different from the light extraction portion 140.

The second electrode E2 according to an example embodiment may include a metal material having a high reflectance to reflect the incident light emitted from the emission layer EL toward the substrate 100. For example, the second electrode E2 may include a single-layered structure or multi-layered structure of any one or more materials selected from aluminum (Al), argentums (Ag), molybdenum (Mo), aurum (Au), magnesium (Mg), calcium (Ca), or barium (Ba), or alloy of two or more materials selected from aluminum (Al), argentums (Ag), molybdenum (Mo), aurum (Au), magnesium (Mg), calcium (Ca), or barium (Ba). The second electrode E2 may be a cathode electrode.

The traveling path of the light generated from the emission layer EL may change toward the light extraction surface (or a light emitting surface) by the concave portion 141 and/or the convex portion 143 of the light extraction portion 140, to thereby increase the external extraction efficiency of the light emitted from the emission layer EL.

The organic light emitting display apparatus according to an example embodiment of the present disclosure may further include a bank layer 170. The bank layer 170 may be disposed on (or over) the planarization layer 130 and an edge portion of the first electrode E1. The bank layer 170 may be configured in (or using) a transparent material or an opaque material. For example, the bank layer 170 may be a transparent bank layer or a black bank layer. For example, the bank layer 170 may include a photosensitizer including a black pigment, in this case, the bank layer 170 may function as a light blocking member between adjacent subpixels SP.

The organic light emitting display apparatus or the display panel 10 according to an example embodiment of the present disclosure may further include a color filter layer 150.

The color filter layer 150 may be disposed between the substrate 100 and the light extraction portion 140. The color filter layer 150 may be disposed between the substrate 100 and the light extraction portion 140 to overlap at least one emission area EA. The color filter layer 150 according to an example embodiment may be disposed between the planarization layer 130 and the protection layer 118 to overlap with the emission area EA. The color filter layer 150 according to another example embodiment may be disposed between the interlayer insulation layer 116 and the protection layer 118 to overlap with the emission area EA, or may be disposed between the substrate 100 and the interlayer insulation layer 116.

The color filter layer 150 may have a size which is wider (or larger) than the emission area EA. The color filter layer 150 may have a size which is greater than the emission area EA and smaller than the light extraction portion 140 of the planarization layer 130, but embodiments according to present disclosure are not limited to thereto, and the color filter layer 150 may have a size which is greater than the light extraction portion 140 of the planarization layer 130. For example, an edge portion of the color filter layer 150 may overlap the bank layer 170. For example, the color filter layer 150 may have a size which is greater than a size corresponding to an entire subpixel area SPA of each subpixel SP, thereby reducing light leakage between adjacent subpixels SP.

The color filter layer 150 may be configured to transmit only the wavelength of a color set in the subpixel SP. For example, as shown in FIG. 2, when one pixel P is configured with the first to fourth subpixels SP1, SP2, SP3, and SP4, the color filter layer 150 may include a red color filter disposed in the first subpixel SP1, a green color filter disposed in the third subpixel SP3, and a blue color filter disposed in the fourth subpixel SP4. The second subpixel SP2 may not include a color filter layer or may include a transparent material to compensate a step difference between adjacent subpixels, thereby emitting white light.

The encapsulation portion 200 may be formed on (or over) the substrate 100 to surround the light emitting device layer 160. The encapsulation portion 200 may be formed on (or over) the second electrode E2. For example, the encapsulation portion 200 may surround the display area AA. The encapsulation portion 200 may protect the thin film transistor and the emission layer EL or the like from external impact and prevent oxygen or/and water (or moisture) and particles from being permeated into the emission layer EL.

The encapsulation portion 200 according to an example embodiment may include a plurality of inorganic encapsulation layer. Furthermore, the encapsulation portion 200 may further include at least one organic encapsulation layer interposed between the plurality of inorganic encapsulation layer. The encapsulation portion 200 according to another example embodiment may be changed to a filler surrounding (or completely surrounding) an entire display area AA. In this case, the counter substrate 300 may be bonded to the substrate 100 by using the filler. The filler may include a getter material that absorbs oxygen or/and water (or moisture) or the like.

The counter substrate 300 may be coupled to the encapsulation portion 200. The counter substrate 300 may be made of a plastic material, a glass material, or a metal material. For example, when the encapsulation portion 200 includes the plurality of inorganic encapsulation layers, the counter substrate 300 may be omitted.

Alternatively, when the encapsulation portion 200 is changed to the filler, the counter substrate 300 may be combined with the filler, in this case, the counter substrate 300 may be made of a plastic material, a glass material, or a metal material.

The organic light emitting display apparatus or display panel 10 according to an example embodiment of the present disclosure may further include a light guide member 400.

The light guide member 400 may be disposed or configured at the light extraction surface 100*a* of the display panel 10. The light guide member 400 may be disposed or configured at a second surface (or the light extraction surface) 100*a* opposite to a first surface of the substrate 100. The light guide member 400 may overlap the light extracting portion 140. For example, the substrate 100 may be disposed between the light guide member 400 and the light extracting portion 140. For example, the substrate 100 may be disposed between the light guide member 400 and the color filter layer 150.

The light guide member 400 according to an example embodiment of the present disclosure may be connected to the second surface 100*a* of the substrate 100 by using an adhesive member (or a first transparent adhesive member) 450. For example, the light guide member 400 may be connected to the entire second surface 100*a* of the substrate 100 by using the adhesive member 450. For example, the light guide member 400 may have a same size as the second surface 100*a* of the substrate 100.

The light guide member 400 may be configured to mitigate a black color (or black rising) or a black visibility characteristic by a reflection of external light in an undriven or turning-off state of the organic light emitting display apparatus or display panel 10. For example, in the non-driving or turning-off state of the organic light emitting display apparatus or display panel 10, external light incident from the outside to the light extracting portion 140 may be double reflected by a concave portion 141 and a convex portion 143 of the light extracting portion 140 and may be emitted to the outside through a light extraction surface 100*a*. The reflected light generated from the light extracting portion 140 may generate a rainbow Mura (or rainbow stain pattern) which has a rainbow color and spreads in a radial form and/or a circular ring pattern in a radial form due to the dispersion characteristics of light according to diffraction properties.

The reflected light generated by the light extracting portion 140 generates the rainbow Mura and/or radial circular ring pattern spread in a radial form due to multiple interference and/or constructive interference of light according to a difference in refractive angle for each wavelength, thereby reducing the characteristics of black visibility.

Figure 4A:
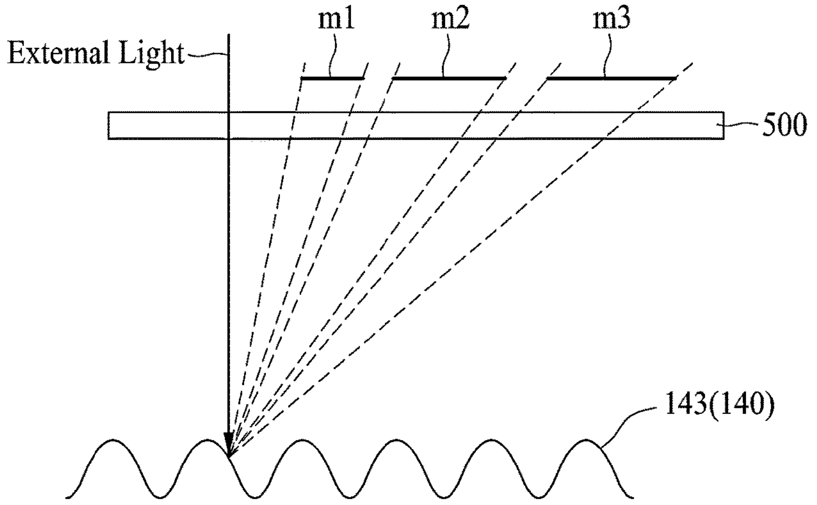
FIG. 4A conceptually illustrates a diffraction dispersion spectrum for reflected light of external light in an organic light emitting display apparatus according to a comparative example.

According to an example embodiment of the present disclosure, as shown in FIG. 4A, the radial-shaped rainbow Mura may be generated by regularly arranging a diffraction dispersion spectrum according to diffraction orders m1, m2, and m3 of reflected light by the convex portion 143 of the light extracting portion 140 serving as a diffraction grating pattern according to a reflection diffraction grating hinge (or equation). The radial-shaped rainbow Mura spreads in the radial form with respect to the convex portion 143 of the light extracting portion 140, and the size and intensity of lights (or diffraction dispersion spectrum) dispersed according to the reflection diffraction grating law may vary with respect to the convex portion 143 of the light extracting portion 140.

Figure 4B:
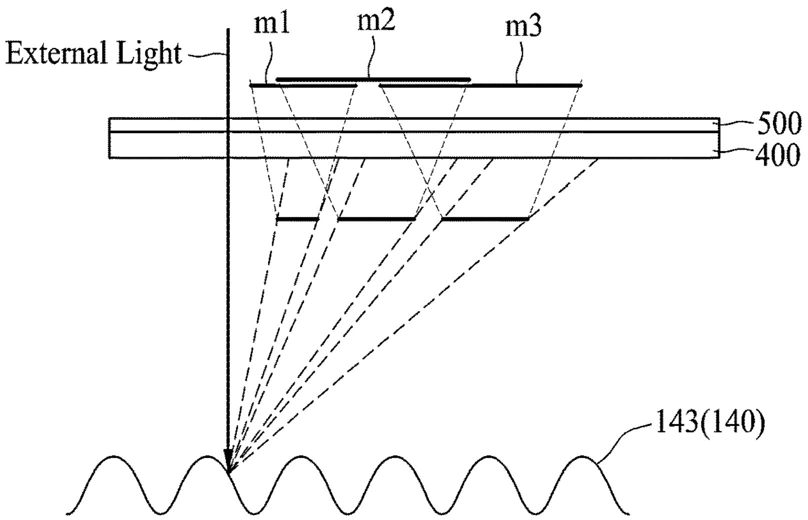
FIG. 4B conceptually illustrates an example of a diffraction dispersion spectrum for reflected light of external light in the organic light emitting display apparatus according to the present disclosure.

The light guide member 400 according to an example embodiment of the present disclosure may be configured to diffract and/or scatter the external light incident on the light extracting portion 140 through the substrate 100 from the outside, or may be configured to re-disperse (or re-scatter) the diffraction dispersion spectrum of the reflected light generated by the light extracting portion 140 based on the light refraction principle according to the cross-sectional shape having the refractive index difference. For example, as shown in FIG. 4B, the light guide member 400 may greatly expand the size of spectrum by reducing the intensity of diffraction dispersion spectrum of reflected light generated according to the convex portion 143 of the light extracting portion 140 or re-dispersing the diffraction dispersion spectrum so that it is possible to suppress or minimize the occurrence of rainbow Mura in the radial form through mixing between the adjacent spectra according to the diffraction orders m1, m2, and m3 of the reflected light.

The light guide member 400 may include a light refraction pattern. The light refraction pattern may diffract and/or scatter the external light incident on the light emitting device layer 160 from the outside based on the light refraction principle having the refractive index difference or may diffract and/or scatter the reflected light generated by the light extracting portion 140. Accordingly, the multiple interference and/or constructive interference of the reflected light generated by the light extracting portion 140 may be off-set or minimized so that it is possible to reduce or minimize the occurrence of rainbow Mura and/or circular ring pattern. Accordingly, the organic light emitting display apparatus according to an example embodiment of the present disclosure may reduce the degradation of a black color (or black rising) or a black visibility characteristic caused by reflection of the external light and may realize real black in the undriven or turning-off state. For example, the light guide member 400 may be a light guide pattern portion, a light refraction portion, a light refraction member, a spectrum dispersion portion, a spectrum reduction portion, or a diffraction spectrum dispersion portion.

Referring to FIG. 3, the organic light emitting display apparatus or display panel 10 according to an example embodiment of the present disclosure may further include a polarizing member 500.

The polarizing member 500 may be disposed on (or over or under) the light guide member 400. For example, the light guide member 400 may be disposed or interposed between the display panel 10 and the polarizing member 500. For example, the light guide member 400 may be disposed or interposed between the substrate 100 and the polarizing member 500.

The polarizing member 500 may be disposed on (or over or under) or connected to the light guide member 400 by using a connection member (or a second transparent adhesive member) 550. Accordingly, the light guide member 400 may be disposed between the light extraction surface 100*a* and the polarizing member 500. For example, the polarizing member 500 may be configured to block the external light reflected by the light extracting portion 140 and the pixel circuit, or the like. For example, the polarizing member 500 may be a circular polarizing member or a circular polarizing film.

The organic light emitting display apparatus or display panel 10 according to an example embodiment of the present disclosure includes the light extracting portion 140 disposed or configured at the emission area EA of the subpixel SP, thereby improving light extraction efficiency by changing a path of light generated from the emission layer EL by the light extracting portion 140. Thus, it is possible to realize high efficiency and high luminance so that the lifespan of the emission layer may be extended, and low power consumption may be realized. In addition, the organic light emitting display apparatus or display panel 10 according to an example embodiment of the present disclosure includes the light guide member 400 at the light extraction surface 100*a* so that it is possible to improve a black color (or black rising) or a black visibility characteristic by reflection of the external light, and to minimize or reduce the occurrence of rainbow Mura and ring Mura phenomena, thereby realizing real black in the undriven or turning-off state.

Figure 5:
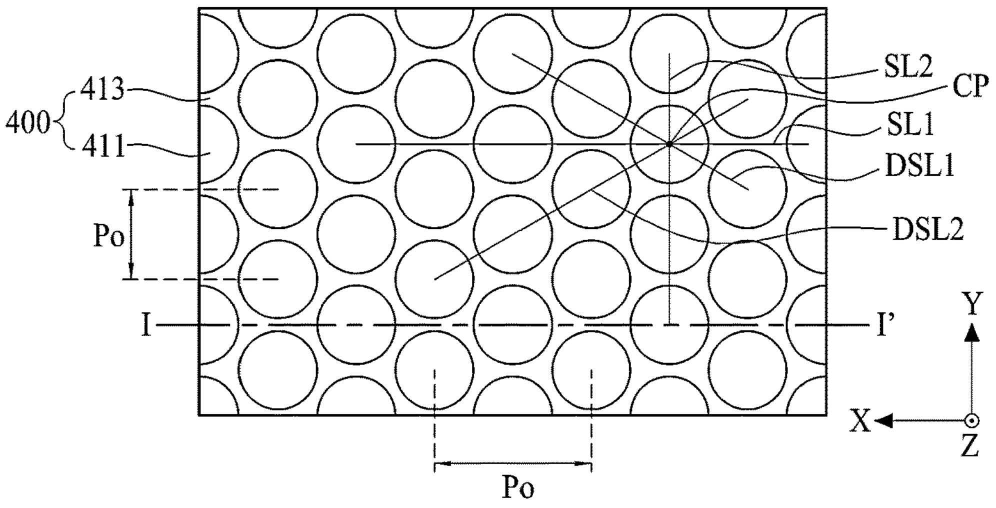
FIG. 5 is a plan view illustrating a portion of a light guide member according to a first example embodiment of the present disclosure.
Figure 6:
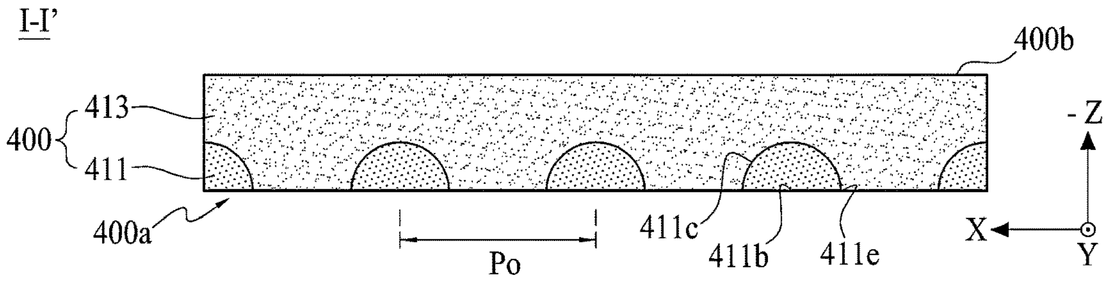
FIG. 6 is an example of a cross-sectional view along I-I' of FIG. 5.

FIG. 5 is a plan view illustrating a portion of the light guide member according to the first example embodiment of the present disclosure, and FIG. 6 is an example of a cross-sectional view along line I-I' of FIG. 5.

Referring to FIGS. 5 and 6, the light guide member 400 according to the first example embodiment of the present disclosure may include a plurality of light refraction patterns 411 and a refractive layer 413.

Each of the plurality of light refraction patterns 411 may be configured with a material having a first refractive index. Each of the plurality of light refraction patterns 411 may be arranged to have a predetermined interval along each of the first direction X and the second direction Y. For example, the plurality of light refraction patterns 411 may configure (or may be configured as) a first refractive layer or a low refractive layer. Accordingly, the plurality of light refraction patterns 411 may be a first refractive layer or a low refractive layer. The first refractive layer including the plurality of light refraction patterns 411 may be a light refraction pattern layer, a lens pattern layer, a structured pattern layer, a regular pattern layer, or a structured lens pattern layer. Each of the plurality of light refraction patterns 411 may be a lens pattern, a scattering pattern, or a diffraction pattern. For example, the plurality of light refraction patterns 411 may be arranged using or arranged in a honeycomb structure or a circle structure corresponding to the plurality of concave portions 141 of the light extracting portion 140 described with reference to FIGS. 2 and 3.

Each of the plurality of light refraction patterns 411 may include a bottom surface 411*b* and a convex surface 411*c*. For example, each of the plurality of light refraction patterns 411 may have a hemispherical shape including the bottom surface 411*b* and the convex surface 411*c*.

According to an example embodiment of the present disclosure, a central portion (or a center portion) CP of each of the plurality of light refraction patterns 411 may be located or aligned at each of a first straight line SL1 parallel to the first direction X, a second straight line SL2 parallel to the second direction Y, and a first diagonal straight line DSL1 and a second diagonal straight line DSL2 between the first direction X and the second direction Y. Accordingly, the pitch Po between the two adjacent light refraction patterns among the plurality of light refraction patterns 411 may be the same along each of the first direction X, the second direction Y, and the diagonal direction between the first direction X and the second direction Y. For example, the plurality of light refraction patterns 411 may be configured to have a same pitch Po along each of the first direction X, the second direction Y, and the diagonal direction between the first direction X and the second direction Y. Herein, the pitch Po of the plurality of light refraction patterns 411 may be a distance (or shortest distance) between the central portions CP of the two adjacent light refraction patterns.

The plurality of light refraction patterns 411 may be spaced apart from each other in the first direction X, the second direction Y, and the diagonal direction. For example, with respect to the second direction Y and the diagonal direction, the distance (or interval) between the plurality of light refraction patterns 411 may be the same as each other. For example, the distance (or interval) between the plurality of light refraction patterns 411 may be the distance (or shortest distance) between the bottom surfaces 411*b* of the two adjacent light refraction patterns 411. For example, in each of the plurality of light refraction patterns 411, when a portion where the bottom surface 411*b* and the convex surface 411*c* meet or the bottom surface 411*b* and the convex surface 411*c* are connected to each other is referred to as a bottom end (or pattern end) 411*e*, the bottom ends 411*e* of the two adjacent light refraction patterns 411 may be connected to each other or may be spaced apart by a predetermined distance without being in contact with each other. Accordingly, the distance (or an interval or a gap) between the plurality of light refraction patterns 411 located at each of the second straight line SL2, the first diagonal straight line DSL1 and the second diagonal straight line DSL2 may be the same as each other.

The refractive layer 413 may be configured to surround each of the plurality of light refraction patterns 411. The refractive layer 413 may be configured to entirely surround the plurality of light refraction patterns 411. The refractive layer 413 may be filled in the space between each of the plurality of light refraction patterns 411. The refractive layer 413 may be configured with a material having a second refractive index different from the first refractive index of the plurality of light refraction patterns 411. For example, the refractive layer 413 may be configured with a material having a higher refractive index than each of the plurality of light refraction patterns 411. For example, the refractive layer 413 may be a second refractive layer or a high refractive layer.

A first surface 400*a* of the light guide member 400 may be connected to or attached to the second surface 100*a* of the substrate 100 by using the adhesive member (or first transparent adhesive member) 450 illustrated in FIG. 3. For example, each of the plurality of light refraction patterns 411 at the first surface 400*a* of the light guide member 400 may be connected to the second surface 100*a* of the substrate 100 by using the adhesive member 450. When the plurality of light refraction patterns 411 are arranged (or disposed) to have a predetermined interval, the first surface of the refractive layer 413 exposed to (or being at) the first surface 400*a* of the light guide member 400 between each of the plurality of light refraction patterns 411 may be connected to the second surface 100*a* of the substrate 100 by using the adhesive member 450. For example, a first surface of the adhesive member 450 may be connected to the first surface of the refractive layer 413 and the plurality of light refraction patterns 411, and a second surface of the adhesive member 450 may be connected to the second surface 100*a* of the substrate 100.

A second surface 400*b* opposite to the first surface 400*a* of the light guide member 400 may be connected to the polarizing member 500 by using the connection member (or second transparent adhesive member) 550 illustrated in FIG. 3. For example, a second surface of the refractive layer 413 at the second surface 400*b* of the light guide member 400 may be connected to the polarizing member 500 by using the connection member 550.

The light guide member 400 according to the first example embodiment of the present disclosure may diffract and/or scatter external light incident on the light emitting device layer 160 from the outside according to the refractive index difference between the plurality of light refraction patterns 411 and the refractive layer 413, or may diffract and/or scatter reflected light generated by the light extracting portion 140, thereby reducing or minimizing the occurrence of rainbow Mura and/or circular ring patterns caused by the reflection of external light.

The inventors of the present disclosure have recognized that the moire phenomenon occurs in the organic light emitting display apparatus or display panel including the light extracting portion 140 and the light guide member 400. Herein, the moire phenomenon may be the phenomenon of pattern having new periodicity as regularity (or regular arrangement structure) of the light refraction pattern in the light guide member 400 overlaps with regularity of the light refraction pattern in the pixel of the display panel. For example, when a plurality of first stripe patterns having a wide gap overlap with a plurality of second stripe patterns having a narrow gap, the moire phenomenon may correspond to the phenomenon having a new third stripe pattern wider than each of the first stripe pattern and the second stripe pattern. As another example, when two sine waves are synthesized, the moire phenomenon may correspond to the beating phenomenon having a new synthetic wave generated when the two sine waves interfere with each other.

Accordingly, the inventors of the present disclosure have conducted extensive research and experiments to reduce or minimize the occurrence of rainbow Mura and/or circular ring patterns and the occurrence of moire phenomenon by the reflection of external light. One or more aspects of the present disclosure provides the organic light emitting display apparatus including a light guide member having a new structure capable of reducing or minimizing the occurrence of rainbow mura and/or circular ring pattern and the occurrence of moire phenomenon. Further details are described below.

Figure 7:
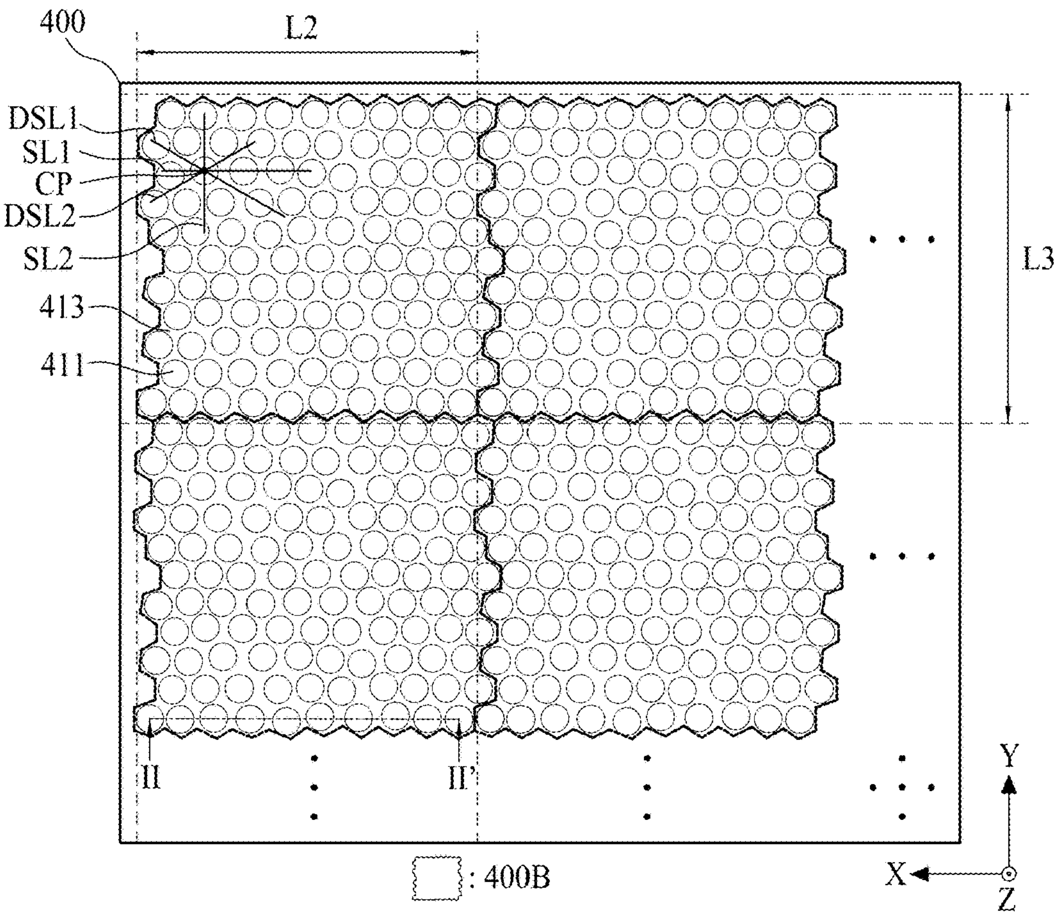
FIG. 7 illustrates a light guide member according to a second example embodiment of the present disclosure.
Figure 8:
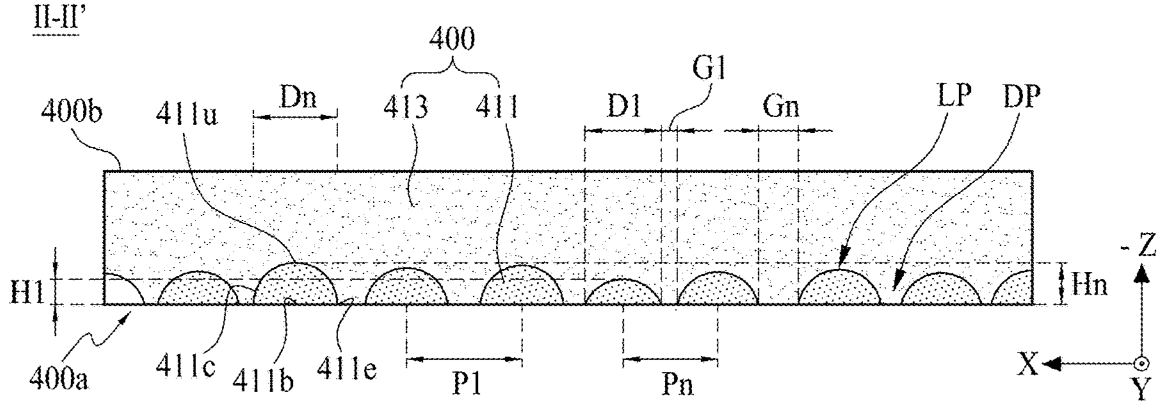
FIG. 8 is an example of a cross-sectional view along II-II' of FIG. 7.

FIG. 7 illustrates a light guide member according to a second example embodiment of the present disclosure, and FIG. 8 is an example of a cross-sectional view along II-II' of FIG. 7.

Referring to FIGS. 7 and 8, the light guide member 400 according to the second example embodiment of the present disclosure may include a plurality of light refraction patterns 411 and a refractive layer 413.

Each of the plurality of light refraction patterns 411 may be composed of a material having a first refractive index. Each of the plurality of light refraction patterns 411 may be arranged to have a random interval (or non-regular interval) G1 to Gn along one or more of a first direction X, a second direction Y, and a diagonal direction between the first direction X and the second direction Y in order to reduce or suppress the occurrence of rainbow Mura and/or circular ring pattern and the occurrence of moire phenomenon. Accordingly, the plurality of light refraction patterns 411 may be a first refractive layer or a low refractive layer. The first refractive layer including the plurality of light refraction patterns 411 may be a light refraction pattern layer, a lens pattern layer, an atypical pattern layer, an irregular pattern layer, an atypical lens pattern layer, or a random pattern layer. Each of the plurality of light refraction patterns 411 may be a lens pattern, a scattering pattern, or a diffraction pattern.

Each of the plurality of light refraction patterns 411 may include a bottom surface 411*b* and a convex surface 411*c*. For example, each of the plurality of light refraction patterns 411 may have a hemispherical shape including the bottom surface 411*b* and the convex surface 411*c*.

The distance (or interval) G1 to Gn between the bottom surfaces 411*b* of at least some of the plurality of light refraction patterns 411 according to another example embodiment of the present disclosure may be different from each other. A central portion (or a center portion) CP of some of the plurality of light refraction patterns 411 may be spaced apart from one or more of a first straight line SL1, a second straight line SL2, a first diagonal straight line DSL1, and a second diagonal straight line DSL2 passing through a central portion (or a center portion) CP of the adjacent light refraction pattern to have different distances from each other. For example, the central portion CP of some of the plurality of light refraction patterns 411 may not be located in at least one of the first straight line SL1, the second straight line SL2, the first diagonal straight line DSL1, and the second diagonal straight line DSL2 passing through the central portion CP of the adjacent light refraction pattern.

The plurality of light refraction patterns 411 may be spaced apart from each other in the first direction X, the second direction Y, and/or the diagonal direction. For example, with respect to the first direction X, the second direction Y and/or the diagonal direction, the distance (or interval) G1 to Gn between the plurality of light refraction patterns 411 may be different from each other. For example, the distance (or interval) G1 to Gn between the plurality of light refraction patterns 411 may be the distance (or shortest distance) between the bottom surfaces 411*b* of the two adjacent light refraction patterns 411. For example, in each of the plurality of light refraction patterns 411, when a portion where the bottom surface 411*b* and the convex surface 411*c* meet or the bottom surface 411*b* and the convex surface 411*c* are connected to each other is referred to as a bottom end (or pattern end) 411*e*, the bottom ends 411*e* of the two adjacent light refraction patterns 411 may be connected to each other or may be spaced apart without being in contact with each other. Accordingly, the distance (or interval) between the bottom ends 411*e* of the plurality of light refraction patterns 411 may be different from each other with respect to the first direction X, the second direction Y, and/or the diagonal direction. For example, the gaps G1 to Gn between the plurality of light refraction patterns 411 may be different from each other along the first direction X, the second direction Y, and/or the diagonal direction.

At least some of the plurality of light refraction patterns 411 according to another example embodiment of the present disclosure may be arranged to have different pitches P1 to Pn. The pitch P1 to Pn between the two adjacent light refraction patterns among the plurality of light refraction patterns 411 may be different from each other along one or more of the first direction X, the second direction Y, and/or the diagonal direction between the first direction X and the second direction Y. For example, the plurality of light refraction patterns 411 may be configured to have the different pitches P1 to Pn along one or more of the first direction X, the second direction Y, and the diagonal direction between the first direction X and the second direction Y. Accordingly, the plurality of light refraction patterns 411 according to another example embodiment of the present disclosure may have a random arrangement structure in order to reduce or suppress the occurrence of rainbow Mura and/or circular ring pattern and the occurrence of moire phenomenon.

According to an example embodiment of the present disclosure, each of the plurality of light refraction patterns 411 may have a diameter D of 1 μm~60 μm. In an example, when each of the plurality of light refraction patterns 411 has a diameter D less than 1 μm, it may become difficult to form each of the plurality of light refraction patterns 411. In another example, when each of the plurality of light refraction patterns 411 has a diameter D greater than 60 μm, each of the plurality of light refraction patterns 411 may be visible, whereby the moire phenomenon might become problematic. In one or more examples, a symbol "~" may represent "–" or "to". Hence, the notation "1 μm~60 μm" may represent 1 μm-60 μm or 1 μm to 60 μm (inclusive of 1 μm and 60 μm).

According to an example embodiment of the present disclosure, the plurality of light refraction patterns 411 may respectively have different heights H1 to Hn. For example, the plurality of light refraction patterns 411 may have different heights H1 to Hn from the first surface 400*a* of the light guide member 400. For example, the height H1 to Hn in each of the plurality of light refraction patterns 411 may be the distance between the first surface 400*a* or the bottom surface 411*b* of the light guide member 400 and the uppermost surface 411*u* of the convex surface 411*c*.

Each of the plurality of light refraction patterns 411 may have a height-to-diameter ratio H/D of 20%~50%. Herein, the height-to-diameter ratio H/D may be the ratio H/D of the height H to the diameter D in the light refraction pattern 411. In an example, when each of the plurality of light refraction patterns 411 has a height-to-diameter ratio H/D less than 20%, a rainbow Mura and/or a circular ring pattern according to the reflection of external light may be generated. In another example, when each of the plurality of light refraction patterns 411 has a height-to-diameter ratio H/D more than 50%, the occurrence of rainbow Mura and/or circular ring pattern may be reduced or suppressed. However, it might be difficult to form each of the plurality of light refraction patterns 411.

According to an example embodiment of the present disclosure, each of the plurality of light refraction patterns 411 may include one or more patterns having a diameter D of 1 μm~60 μm and a height-to-diameter ratio H/D of 20%~50%.

The refractive layer 413 may be configured to surround each of the plurality of light refraction patterns 411. The refractive layer 413 may be configured to entirely surround the plurality of light refraction patterns 411. The refractive layer 413 may be filled in the space between each of the plurality of light refraction patterns 411. The refractive layer 413 may be composed of a material having a second refractive index. For example, the refractive layer 413 may be composed of a material having a higher refractive index than each of the plurality of light refraction patterns 411. For example, the refractive layer 413 may be a second refractive layer or a high refractive layer.

The difference in refractive index between the first refractive index and the second refractive index may be 0.05~0.40. For example, when the first refractive index is denoted by "n1" and the second refractive index is denoted by "n2", the refractive index difference "n1−n2" between the first refractive index n1 and the second refractive index n2 may be 0.05~0.40. For example, when the refractive index difference "n1−n2" exceeds 0.40, material reliability of the plurality of light refraction patterns 411 and the refractive layer 413 may be deteriorated, but the occurrence of rainbow Mura and/or circular ring pattern by the reflection of external light may be reduced or suppressed. For example, when the refractive index difference "n1−n2" is less than 0.05, material reliability of the plurality of light refraction patterns 411 and the refractive layer 413 may be secured, but the rainbow Mura and/or circular ring pattern by the reflection of external light may be generated.

The first surface 400*a* of the light guide member 400 may be connected to or attached to the second surface 100*a* of the substrate 100 by using the adhesive member (or first transparent adhesive member) 450 illustrated in FIG. 3. For example, each of the plurality of light refraction patterns 411 on the first surface 400*a* of the light guide member 400 may be connected to the second surface 100*a* of the substrate 100 by using the adhesive member 450. Furthermore, when the plurality of light refraction patterns 411 are arranged at a predetermined interval, the first surface of the refractive layer 413 exposed to (or being at) the first surface 400*a* of the light guide member 400 between each of the plurality of light refraction patterns 411 may be connected to the second surface 100*a* of the substrate 100 by using the adhesive member 450.

The second surface 400*b* opposite to the first surface 400*a* of the light guide member 400 may be connected to the polarizing member 500 by using a connection member (or second transparent adhesive member) 550 as described with reference to FIG. 3. For example, the second surface of the refractive layer 413 on the second surface 400*b* of the light guide member 400 may be connected to the polarizing member 500 by using connection member 550.

According to an example embodiment of the present disclosure, when the plurality of light refraction patterns 411 are configured to have a random arrangement structure on the entire display area of the display panel, a sparkle phenomenon may occur due to non-regularity (or non-formation) of the plurality of light refraction patterns 411. Herein, the sparkle phenomenon may correspond to the phenomenon of stain in which a bright portion LP and a dark portion DP appear non-regularly according to the pitches (or interval) P1 to Pn of the plurality of light refraction patterns 411. For example, the convex surface (or upper surface) 411*c* of each of the plurality of light refraction patterns 411 may be a bright portion LP, and a gap space between the plurality of light refraction patterns 411 may be a dark portion DP. For example, the gap space corresponding to the dark portion DP may be a space between the bottom surfaces 411*b* of the plurality of light refraction patterns 411. For example, the gap space may be a pattern spacing portion, a concave portion of the first refractive layer, a valley portion of the first refractive layer, or a pattern undisposed portion of the first refractive layer.

Figure 9:
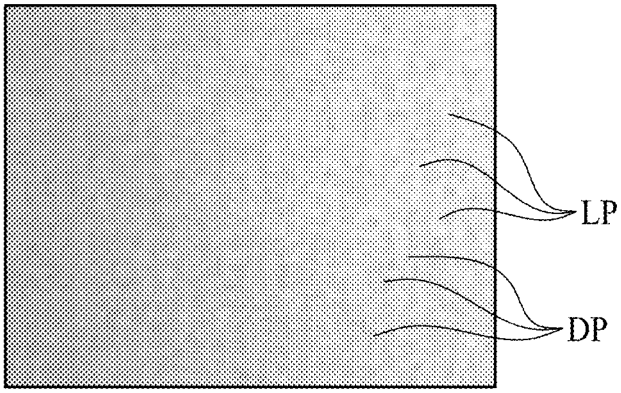
FIG. 9 is a photograph showing a sparkle phenomenon generated in the organic light emitting display apparatus including the light guide member according to the second example embodiment of the present disclosure.

For example, as shown in FIGS. 5 and 6, when the plurality of light refraction patterns 411 are regularly disposed, the sparkle phenomenon may not be seen due to a uniform contrast difference between the bright portion LP and the dark portion DP. Alternatively, as shown in FIGS. 7 and 8, when the plurality of light refraction patterns 411 are arranged irregularly, the sparkle phenomenon may be recognized due to a non-uniform contrast difference between the bright portion LP and the dark portion DP, as shown in FIG. 9.

The light guide member 400 according to the second example embodiment of the present disclosure may include a plurality of blocks 400B in order to reduce or minimize the sparkle phenomenon.

The plurality of blocks 400B may be connected to each other along each of the first direction X and the second direction Y. For example, the plurality of light refraction patterns 411 in the light guide member 400 may be blocked (or grouped) into the plurality of blocks 400B. Accordingly, each of the plurality of blocks 400B may be a pattern block, a refractive pattern block, a guide pattern block, or a guide refraction pattern block, or the like.

The plurality of blocks 400B may have a same light refraction patterns 411. For example, the plurality of light refraction patterns 411 at each of the plurality of blocks 400B may be arranged to have a random interval (or irregular interval) along one or more of the first direction X, the second direction Y, and the diagonal direction between the first direction X and the second direction Y in order to reduce or suppress the occurrence of rainbow Mura and/or circular ring pattern and the occurrence of moire phenomenon. That is, the plurality of light refraction patterns 411 may have a same atypical arrangement structure at each of the plurality of blocks 400B. For example, the plurality of light refraction patterns 411 may have a same atypical arrangement structure for each of the plurality of blocks 400B. Accordingly, the plurality of light refraction patterns 411 at each of the plurality of blocks 400B may be an irregular block pattern, an irregular block pattern, or a non-regular block pattern.

The light guide member 400 according to the second example embodiment of the present disclosure may comprise a structure in which one block 400B including the plurality of light refraction patterns 411 having the atypical arrangement structure (or non-regular arrangement structure) is repeatedly arranged along each of the first direction X and the second direction Y and connected to each other. Accordingly, the light guide member 400 may generate the moire phenomenon due to regularity according to the repetitive arrangement structure of the block 400B including the plurality of light refraction patterns 411 having the atypical arrangement structure. That is, since the plurality of light refraction patterns 411 have a same atypical arrangement structure for each of the plurality of blocks 400B, the moire phenomenon may be generated due to regularity of the plurality of light refraction patterns 411 at each of the plurality of blocks 400B. For example, the light guide member 400 according to the second example embodiment of the present disclosure may reduce or minimize the moire phenomenon due to the atypical arrangement structure of the plurality of light refraction patterns 411 disposed at each of the plurality of blocks 400B. However, the sparkle phenomenon may occur due to regularity according to the repetitive arrangement structure of the block 400B.

According to another example embodiment, the plurality of light refraction patterns 411 may have the different atypical arrangement structures for the plurality of blocks 400B. However, in this case, the sparkle phenomenon may be recognized due to the non-uniform brightness difference between the dark portion DP and the bright portion LP of the plurality of light refraction patterns 411 at each of the plurality of blocks 400B.

Each end of the plurality of blocks 400B or the boundary between the adjacent blocks 400B may be disposed in the refractive layer 413. Accordingly, the ends of adjacent blocks 400B may have the same shape as each other. Each end of the plurality of blocks 400B or the boundary between the adjacent blocks 400B may have a non-linear shape, a zigzag shape, or a curved shape. For example, when each end of the plurality of blocks 400B or the boundary between the adjacent blocks 400B is provided at one or more refraction patterns 411 and refractive layer 413, each end of the plurality of blocks 400B or the boundary between the adjacent blocks 400B may not have the same shape as each other, whereby the contrast difference may be generated at each end of the plurality of blocks 400B or the boundary between the adjacent blocks 400B. Accordingly, a stain corresponding to the shape of the boundary between the plurality of blocks 400B may be generated.

In order to reduce or minimize the moire phenomenon and sparkle phenomena at the same time, each of the plurality of blocks 400B according to an example embodiment of the present disclosure may have a size L2 greater than 87 μm and less than or equal to 800 mm. For example, the size L2 of each of the plurality of blocks 400B may be greater than 87 μm and less than or equal to 800 mm. For example, a horizontal size (or horizontal length) L2 and a vertical size (or vertical length) L3 at each of the plurality of blocks 400B may be greater than 87 μm and less than or equal to 800 mm. For example, each of the blocks 400B may have a horizontal size L2 and a vertical size L3 greater than 87 μm and less than or equal to 800 mm.

According to an example embodiment of the present disclosure, when each of the plurality of blocks 400B has a size of 87 μm or less, a level of the sparkle phenomenon may be reduced. For example, the resolution according to the eyesight of person is 1 minute angle (1/60 degrees), and the size (viewing distance×tan (1/60)) of point distinguishable from the viewing distance of 0.15 m may be 43.6 μm. Since at least two points are required to classify the shade, the size of shade distinguishable from the viewing distance of 0.15 m may be 87 μm. Accordingly, when each of the plurality of blocks 400B has a size of 87 μm or less, the sparkle phenomenon is not visible. Thus, in order to reduce or minimize both the moire phenomenon and the sparkle phenomenon, each of the plurality of blocks 400B according to an example embodiment of the present disclosure may have a size L2 greater than 87 μm and less than or equal to 800 mm. For example, based on the viewing distance, the size L2 of each of the plurality of blocks 400B may be greater than 200 μm and less than or equal to 800 mm, but embodiments according to the present disclosure are not limited thereto.

When each of the plurality of blocks 400B has a size equal to or smaller than 87 μm, the size of each of the plurality of blocks 400B is the same as or similar to the size of the pixel, whereby the moire phenomenon may occur due to interference between the light refraction pattern 411 and the pixel.

According to an example embodiment of the present disclosure, when each of the plurality of blocks 400B has a size exceeding 800 mm, the level of sparkle phenomenon may increase due to non-regularity of the plurality of light refraction patterns 411 arranged at each of the plurality of blocks 400B having a relatively large size. For example, since the light guide member 400 is arranged close to the light extraction surface of the display panel, the sparkle phenomenon may be severe when each of the blocks 400B has a size exceeding 800 mm.

Each of a plurality of blocks 400B according to another example embodiment of the present disclosure may have a size L2 of at least twice with respect to the pixel pitch PP (See FIG. 2). For example, the ratio L2/PP of the size L2 at each of the plurality of blocks 400B to the pixel pitch PP may be two or more. For example, the ratio L2/PP of the size L2 at each of the plurality of blocks 400B to the pixel pitch PP may be two or more within the range greater than 87 μm and equal to or less than 800 mm.

The light guide member 400 according to the second example embodiment of the present disclosure may diffract and/or scatter external light incident on the light emitting device layer 160 from the outside according to the refractive index difference between the plurality of light refraction patterns 411 and the refractive layer 413, or may diffract and/or scatter reflected light generated by the light extracting portion 140, thereby reducing or minimizing the occurrence of rainbow Mura and/or circular ring patterns caused by the reflection of external light. Furthermore, the light guide member 400 according to the second example embodiment of the present disclosure includes the plurality of light refraction patterns 411 having the irregular arrangement structure (or atypical arrangement structure) different from regularity of pixels in the display panel so that it is possible to reduce or minimize the moire phenomenon caused by interference between the arrangement structure of the plurality of light refraction patterns 411 and the arrangement structure of the pixels in the display panel. Moreover, in the light guide member 400 according to the second example embodiment of the present disclosure, each of the plurality of blocks 400B including the plurality of light refraction patterns 411 having the atypical arrangement structure has the size greater than 87 μm and equal to or less than 800 mm, thereby reducing or minimizing the moire and sparkle phenomenon.

As described above, the organic light emitting display apparatus or the display panel according to another example embodiment of the present disclosure includes the plurality of blocks 400B including the plurality of light refraction patterns 411 having the atypical arrangement structure, thereby improving a black color (or black rising) or a black visibility characteristic due to the reflection of external light, realizing real black in the undriven or turn-off state, and minimizing or reducing the moire phenomenon caused by interference between the light refraction pattern and the pixel and the sparkle phenomenon due to the contrast difference caused by the light refraction pattern. Therefore, the organic light emitting display apparatus or display panel according to another example embodiment of the present disclosure may improve image quality and improve visibility of viewer to an image.

Figure 10:
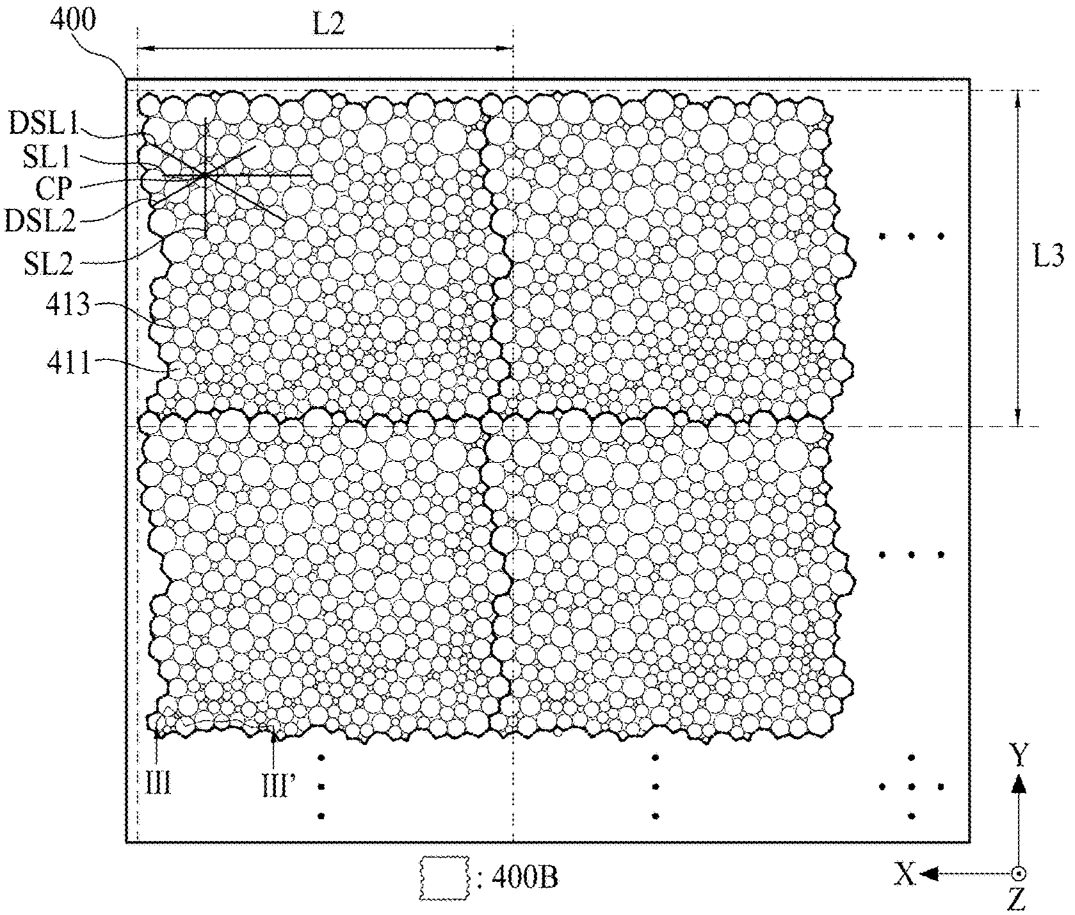
FIG. 10 illustrates a light guide member according to a third example embodiment of the present disclosure.
Figure 11:
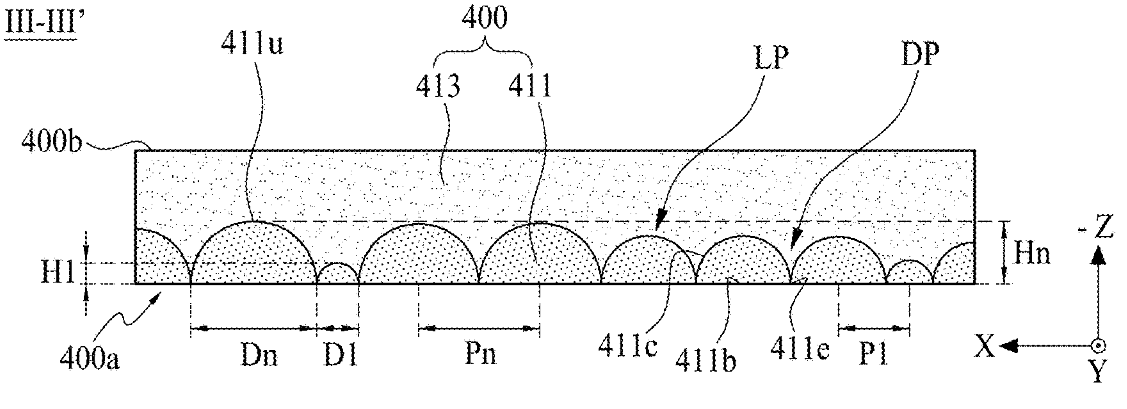
FIG. 11 is an example of a cross-sectional view along III-III' of FIG. 10.

FIG. 10 is a view illustrating a light guide member according to a third example embodiment of the present disclosure, and FIG. 11 is an example of a cross-sectional view along III-III' of FIG. 10.

Referring to FIGS. 10 and 11, the light guide member 400 according to the third example embodiment of the present disclosure may include a plurality of light refraction patterns 411 and a refractive layer 413.

The plurality of light refraction patterns 411 may include a material having a first refractive index in a same manner as the plurality of light refraction patterns 411 described with reference to FIGS. 7 and 8 and may also have an atypical arrangement structure having a hemispherical shape including a bottom surface 411*b* and a convex surface 411*c* in a same manner as the plurality of light refraction patterns 411 described with reference to FIGS. 7 and 8, and thus, repetitive descriptions may be omitted.

A central portion (or a center portion) CP of one or more of the plurality of light refraction patterns 411 may be spaced apart from one or more of a first straight line SL1, a second straight line SL2, a first diagonal straight line DSL1, and a second diagonal straight line DSL2. For example, a pitch P1 to Pn between the two adjacent light refraction patterns 411 among the plurality of light refraction patterns 411 may be different from each other along one or more of the first direction X, the second direction Y, and the diagonal direction between the first direction X and the second direction Y. For example, the plurality of light refraction patterns 411 may be configured to have the different pitches P1 to Pn along one or more of the first direction X, the second direction Y, and the diagonal direction between the first direction X and the second direction Y.

At least some of the plurality of light refraction patterns 411 according to another example embodiment of the present disclosure may be disposed to be connected to each other. At least some of the plurality of light refraction patterns 411 may be arranged while being not overlapped with each other and being connected to each other. The plurality of light refraction patterns 411 may be configured while being not overlapped with each other and being connected to each other along one or more of a first direction X, a second direction Y, and a diagonal direction between the first direction X and the second direction Y. For example, a bottom surface 411*b* of each of the plurality of light refraction patterns 411 may be connected (or contacted) to a bottom surface 411*b* of the adjacent light refraction pattern 411 along one or more directions among the first direction X, the second direction Y, and the diagonal direction between the first direction X and the second direction Y. For example, an end 411*e* of the bottom surface 411*b* of each of the plurality of light refraction patterns 411 may be connected (or contacted) to an end 411*e* of the bottom surface 411*b* of the adjacent light refraction pattern 411 along one or more directions among the first direction X, the second direction Y, and the diagonal direction between the first direction X and the second direction Y.

The plurality of light refraction patterns 411 may respectively have different diameters D1 to Dn within a range of 1 μm to 60 μm. For example, the plurality of light refraction patterns 411 are not overlapped with each other and are connected to each other along at least one of the first direction X, the second direction Y, and the diagonal direction between the first direction X and the second direction Y, whereby the plurality of light refraction patterns 411 may respectively have the various diameters D1 to Dn within a range of 1 μm to 60 μm. For example, a first refractive layer composed of the plurality of light refraction patterns 411 may have a structure in which the plurality of light refraction patterns 411 having a relatively small diameter are arranged or filled in the space between each of the plurality of light refraction patterns 411 having a relatively large diameter.

The plurality of light refraction patterns 411 may respectively have different heights H1 to Hn. For example, the plurality of light refraction patterns 411 may respectively have different heights H1 to Hn from a first surface 400*a* of a light guide member 400.

The plurality of light refraction patterns 411 may have different height-to-diameter ratios H/D within a range of 20% to 50%. For example, the plurality of light refraction patterns 411 are not overlapped with each other and are connected to each other along at least one of the first direction X, the second direction Y, and the diagonal direction between the first direction X and the second direction Y, whereby the plurality of light refraction patterns 411 may have the various height-to-diameter ratios H/D within a range of 20% to 50%.

The refractive layer 413 may be configured on (or over) the plurality of light refraction patterns 411. The refractive layer 413 may be configured to entirely surround the plurality of light refraction patterns 411. The refractive layer 413 may be filled at a concave portion (or valley portion) between each of the plurality of light refraction patterns 411.

The refractive layer 413 may be composed of a material having a second refractive index. For example, the refractive layer 413 may be composed of a material having a higher refractive index than each of the plurality of light refraction patterns 411. For example, a refractive index difference "n1-n2" between the first refractive index n1 and the second refractive index n2 may be 0.05~0.40.

In case of the light guide member 400 according to the third example embodiment of the present disclosure, the plurality of light refraction patterns 411 are not overlapped with each other and are connected to each other along at least one of the first direction X, the second direction Y, and the diagonal direction between the first direction X and the second direction Y so that it is possible to reduce a height difference (or step) between the concave portion (or valley portion) between each of the plurality of light refraction patterns 411 and the upper portion of each of the plurality of light refraction patterns 411. Accordingly, it is possible to reduce the difference in contrast between a bright portion LP and a dark portion DP generated according to the height of the plurality of light refraction patterns 411, whereby the sparkle phenomenon may be reduced or minimized.

The light guide member 400 according to the third example embodiment of the present disclosure may comprise a plurality of blocks 400B in order to further reduce or minimize the sparkle phenomenon.

The plurality of blocks 400B may be connected to each other along each of the first direction X and the second direction Y. The plurality of light refraction patterns 411 may have a same atypical arrangement structure in each of the plurality of blocks 400B. For example, the plurality of light refraction patterns 411 may have a same atypical arrangement structure for each of the plurality of blocks 400B. Each of the plurality of blocks 400B may have a size greater than 87 μm and less than or equal to 800 mm. Each of the plurality of blocks 400B may have a size L2 of at least twice with respect to the pixel pitch PP (See FIG. 2). For example, the ratio L2/PP of the size L2 at each of the plurality of blocks 400B to the pixel pitch PP may be two or more within the range greater than 87 μm and equal to and less than 800 mm. The plurality of blocks 400B are the same as or substantially the same as the plurality of blocks 400B described with reference to FIGS. 7 and 8, and thus repetitive description thereof may be omitted.

The light guide member 400 according to the third example embodiment of the present disclosure is the same as the light guide member 400 according to the second example embodiment of the present disclosure. That is, the light guide member 400 according to the third example embodiment of the present disclosure may reduce or minimize the occurrence of rainbow Mura and/or circular ring patterns due to reflection of external light, and may further reduce or minimize the moire and sparkle phenomena.

As described above, the organic light emitting display apparatus or the display panel according to another example embodiment of the present disclosure includes the plurality of blocks 400B including the plurality of light refraction patterns 411 having the atypical arrangement structure and connected to each other, thereby further improving a black color (or black rising) or a black visibility characteristic due to the reflection of external light, realizing real black in the undriven or turn-off state, and further minimizing or reducing the moire phenomenon caused by interference between the light refraction pattern and the pixel and the sparkle phenomenon due to the contrast difference caused by the light refraction pattern. Therefore, the organic light emitting display apparatus or display panel according to another example embodiment of the present disclosure may improve image quality and further improve visibility of viewer to an image.

Figure 12:
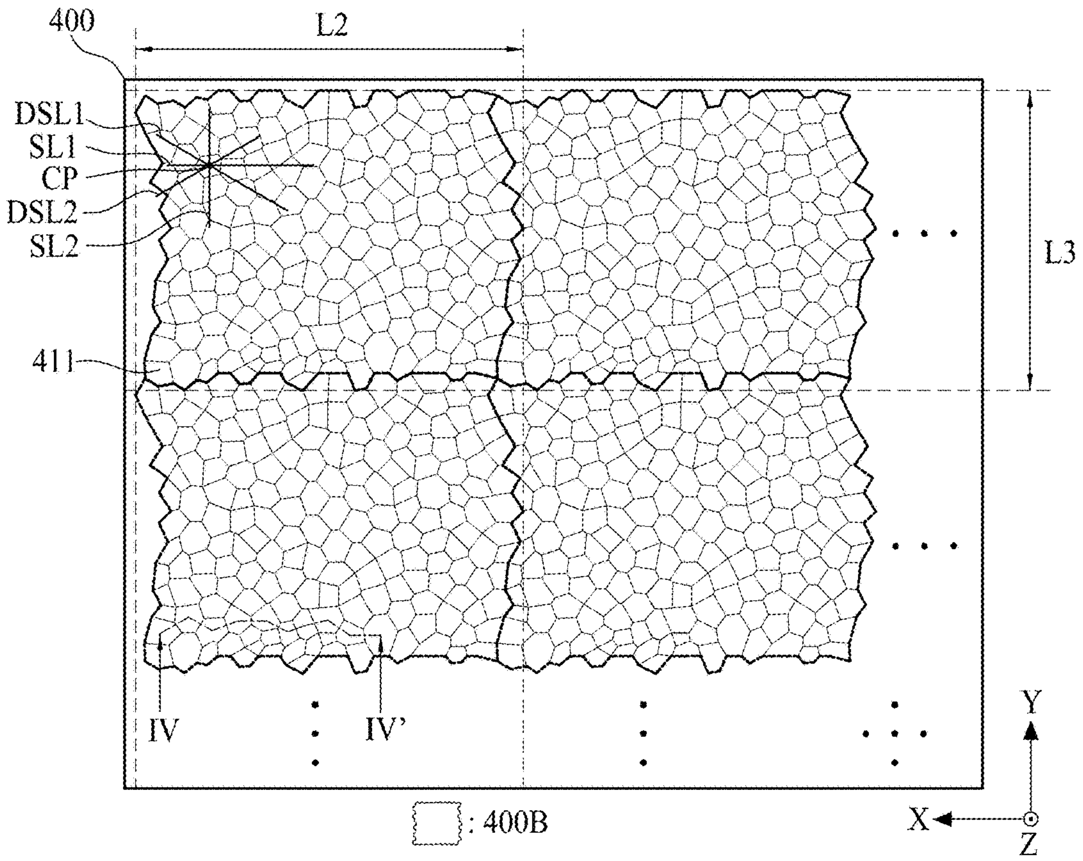
FIG. 12 illustrates a light guide member according to a fourth example embodiment of the present disclosure.
Figure 13:
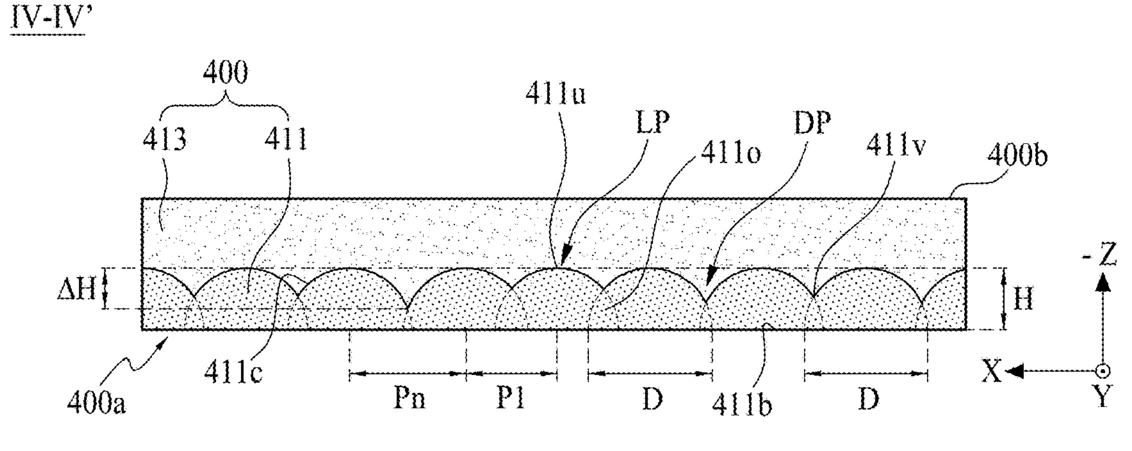
FIG. 13 is an example of a cross-sectional view along III-III' of FIG. 12.

FIG. 12 illustrates a light guide member according to a fourth example embodiment of the present disclosure, and FIG. 13 is an example of a cross-sectional view along III-III' of FIG. 12.

Referring to FIGS. 12 and 13, the light guide member 400 according to the fourth example embodiment of the present disclosure may include a plurality of light refraction patterns 411 and a refractive layer 413.

The plurality of light refraction patterns 411 may include a material having a first refractive index in a same manner as the plurality of light refraction patterns 411 described with reference to FIGS. 7 and 8 and may also have an atypical arrangement structure having a hemispherical shape including a bottom surface 411*b* and a convex surface 411*c* in a same manner as the plurality of light refraction patterns 411 described with reference to FIGS. 7 and 8, and thus, repetitive descriptions may be omitted.

A central portion (or a center portion) CP of one or more of the plurality of light refraction patterns 411 may be spaced apart from one or more of a first straight line SL1, a second straight line SL2, a first diagonal straight line DSL1, and a second diagonal straight line DSL2. For example, a pitch P1 to Pn between the two adjacent light refraction patterns 411 among the plurality of light refraction patterns 411 may be different from each other along one or more of the first direction X, the second direction Y, and the diagonal direction between the first direction X and the second direction Y. For example, the plurality of light refraction patterns 411 may be configured to have the different pitches P1 to Pn along one or more of the first direction X, the second direction Y, and the diagonal direction between the first direction X and the second direction Y.

The plurality of light refraction patterns 411 may be disposed to overlap each other. The plurality of light refraction patterns 411 may be configured to overlap each other on a same plane. The plurality of light refraction patterns 411 may be configured to overlap each other along each of a first direction X, a second direction Y, and a diagonal direction between the first direction X and the second direction Y. For example, the plurality of light refraction patterns 411 may overlap each other along all directions on a same plane. For example, the overlapping ratio (or area) between the two light refraction patterns 411 overlapping each other may be 20% to 90% based on the area of one light refraction pattern 411, but embodiments according to the present disclosure are not limited thereto. Accordingly, a height difference (or step difference) "ΔH" between a concave portion (or valley portion) between each of the plurality of light refraction patterns 411 and an uppermost surface 411*u* of each of the plurality of light refraction patterns 411 may be reduced. Thus, a difference in contrast between a bright portion LP and a dark portion DP generated according to the height difference "ΔH" of the plurality of light refraction patterns 411 may be reduced, thereby further reducing or minimizing a sparkle phenomenon.

Each of the plurality of light refraction patterns 411 may have a same diameter D within a range of 1 μm to 60 μm. Each of the plurality of light refraction patterns 411 may have a same height-to-diameter ratio H/D within a range of 20% to 50%. For example, the uppermost surface 411*u* of each of the plurality of light refraction patterns 411 may be the same as a height H of a first surface 400*a* of the light guide member 400.

According to an example embodiment of the present disclosure, a first refractive layer composed of the plurality of light refraction patterns 411 may include an overlap region (or pattern overlap region) 411*o* in which some of the plurality of light refraction patterns 411 having a same diameter D and a same height H overlap each other. For example, the overlapping region 411*o* may be an area in which the convex surfaces 411*c* of the two adjacent light refraction patterns 411 are overlapped or combined with each other. The first refractive layer may include a pattern connection portion 411*v* in which the convex surfaces 411*c* of the two adjacent light refraction patterns 411 meet or are connected to each other.

The pattern connection portion 411*v* may be respectively disposed between each of the plurality of light refraction patterns 411, whereby the first refractive layer may include the plurality of pattern connection portions 411*v*. Each of the plurality of pattern connection portions 411*v* may be a corresponding one of a plurality of concave portions (or valley portions) concavely formed between the plurality of light refraction patterns 411.

The distance between at least a part of the plurality of pattern connection portions (or concave portions) 411*v* and the first surface 400*a* of the light guide member 400 may be different from each other. For example, at least some of the plurality of pattern connection portions (or concave portions) 411*v* may have different heights from the first surface 400*a* of the light guide member 400.

Each of the plurality of pattern connection portions (or concave portions) 411*v* may be located closer to the first surface 400*a* of the light guide member 400 than the uppermost surface 411*u* of each of the plurality of light refraction patterns 411. Each of the plurality of pattern connection portions (or concave portions) 411*v* may be spaced apart from the first surface 400*a* of the light guide member 400. For example, each of the plurality of pattern connection portions (or concave portions) 411*v* may be located between the first surface 400*a* of the light guide member 400 and the convex surface 411*c* of each of the plurality of light refraction patterns 411.

The refractive layer 413 may be configured on (or over) the plurality of light refraction patterns 411. The refractive layer 413 may be configured to entirely surround the plurality of light refraction patterns 411. The refractive layer 413 may be filled at the plurality of pattern connection portions (or concave portions) 411*v* respectively disposed between the plurality of light refraction patterns 411. For example, the refractive layer 413 is not exposed to the first surface 400*a* of the light guide member 400. For example, as the plurality of light refraction patterns 411 overlap each other, the first surface 400*a* of the light guide member 400 may be composed of only the bottom surface 411*b* of each of the plurality of light refraction patterns 411. The refractive layer 413 may be composed of a material having a second refractive index. For example, the refractive layer 413 may be composed of a material having a higher refractive index than each of the plurality of light refraction patterns 411. For example, a refractive index difference "n1−n2" between a first refractive index n1 and a second refractive index n2 may be 0.05~0.40.

The light guide member 400 according to the fourth example embodiment of the present disclosure may comprise the first surface 400*a* composed of the bottom surface 411*b* of each of the plurality of light refraction patterns 411, and a second surface 400*b* composed of the refractive layer 413. For example, the first surface 400*a* or the bottom surface 411*b* of each of the plurality of light refraction patterns 411 in the light guide member 400 may be connected to a second surface 100*a* of a substrate 100 by using an adhesive member (or first transparent adhesive member) 450 illustrated in FIG. 3. For example, the second surface 400*b* or the refractive layer 413 of the light guide member 400 may be connected to a polarizing member 500 by using a connection member (or a second transparent adhesive member) 550.

In the light guide member 400 according to the fourth example embodiment of the present disclosure, the plurality of light refraction patterns 411 are overlapped with each other, the difference (or step) "ΔH" between the height of the pattern connection portion 411*v* (or concave portions or the valley portions) between each of the plurality of light refraction patterns 411 and the height H of the uppermost surface 411*u* of each of the plurality of light refraction patterns 411 may be further reduced. Accordingly, the difference in contrast between a bright portion LP and a dark portion DP according to the height of the plurality of light refraction patterns 411 is further reduced, whereby a sparkle phenomenon may be further reduced or minimized.

The light guide member 400 according to the fourth example embodiment of the present disclosure may comprise a plurality of blocks 400B in order to further reduce or minimize the sparkle phenomenon.

The plurality of blocks 400B may be connected to each other along each of the first direction X and the second direction Y. The plurality of light refraction patterns 411 may have a same atypical arrangement structure in each of the plurality of blocks 400B. For example, the plurality of light refraction patterns 411 may have a same atypical arrangement structure for each of the plurality of blocks 400B. Each of the plurality of blocks 400B may have a size greater than 87 μm and less than or equal to 800 mm. Each of the plurality of blocks 400B may have a size L2 of at least twice with respect to the pixel pitch PP (See FIG. 2). For example, the ratio L2/PP of the size L2 at each of the plurality of blocks 400B to the pixel pitch PP may be two or more within the range greater than 87 μm and equal to or less than 800 mm. The plurality of blocks 400B are the same as or substantially the same as the plurality of blocks 400B described with reference to FIGS. 7 and 8, and thus repetitive description thereof may be omitted.

The light guide member 400 according to the fourth example embodiment of the present disclosure is the same as the light guide member 400 according to the second example embodiment of the present disclosure. That is, the light guide member 400 according to the third example embodiment of the present disclosure may reduce or minimize the occurrence of rainbow Mura and/or circular ring patterns due to reflection of external light, and may further reduce or minimize the moire and sparkle phenomena.

As described above, the organic light emitting display apparatus or the display panel according to another example embodiment of the present disclosure includes the plurality of blocks 400B including the plurality of light refraction patterns 411 having the atypical arrangement structure and overlapping with each other, thereby further improving a black color (or black rising) or a black visibility characteristic due to the reflection of external light, realizing real black in the undriven or turn-off state, and further minimizing or reducing the moire phenomenon caused by interference between the light refraction pattern and the pixel and the sparkle phenomenon due to the contrast difference caused by the light refraction pattern. Therefore, the organic light emitting display apparatus or display panel according to another example embodiment of the present disclosure may improve image quality and further improve visibility of an image to a viewer.

Figure 14:
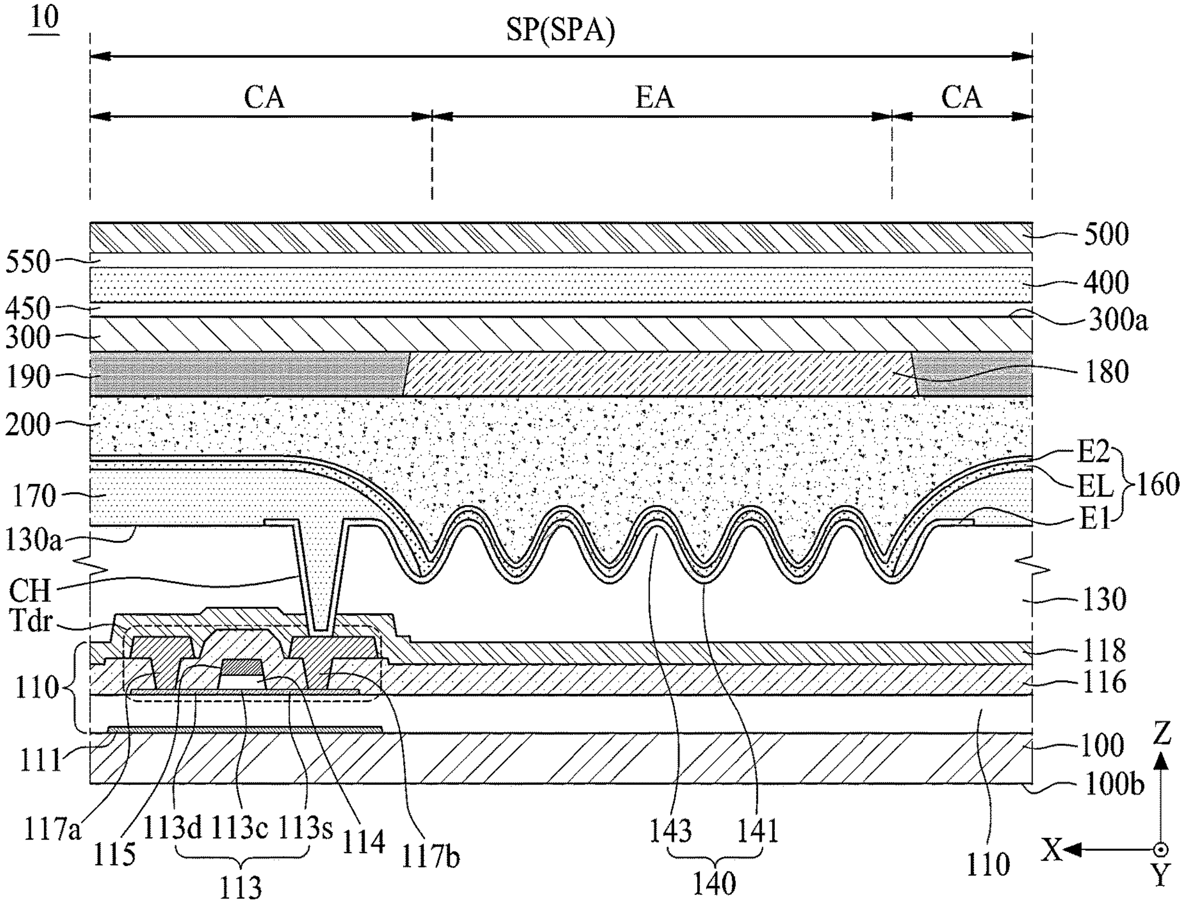
FIG. 14 illustrates an organic light emitting display apparatus according to another example embodiment of the present disclosure.

FIG. 14 illustrates an organic light emitting display apparatus according to another example embodiment of the present disclosure. The organic light emitting display apparatus of FIG. 14 is obtained by changing the organic light emitting display apparatus shown in FIGS. 2 to 13 into a top emission structure. Accordingly, repetitive descriptions of components except for the configuration related to the top emission structure of the organic light emitting display apparatus are omitted or briefly described.

Referring to FIG. 14, the organic light emitting display apparatus according to another example embodiment of the present disclosure may include a display panel 10 having a light guide member 400. For example, the organic light emitting display apparatus according to another example embodiment of the present disclosure may include a substrate 100, an encapsulation portion 200, a counter substrate 300, and a light guide member 400.

The display panel 10 may include a pixel circuit layer 110, a planarization layer 130 including a light extracting portion 140, and a light emitting device layer 160. For example, the light extracting portion 140 may be disposed between the substrate 100 and the light guide member 400. The substrate 100 may be substantially the same as the substrate 100 described in FIGS. 1 and 3, except that a first electrode E1 of the light emitting device layer 160 is made of a reflective electrode material and a second electrode E2 is made of a transparent electrode material, and thus, repetitive descriptions may be omitted.

The encapsulation portion 200 is disposed on (or over) the substrate 100, is configured to protect the light emitting device layer 160, and is substantially the same as the encapsulation portion 200 described in FIG. 3, and thus, repetitive descriptions may be omitted.

The counter substrate 300 is disposed on the substrate 100, is configured to protect the encapsulation portion 200, and is substantially the same as the counter substrate 300 described in FIG. 3, whereby repetitive description thereof may be omitted. The counter substrate 300 may be made of a transparent plastic material. The front surface (or the upper surface) of the counter substrate 300 may be a light extraction surface 300*a*.

The organic light emitting display apparatus or the display panel 10 according to another example embodiment of the present disclosure may further include a color filter layer 180.

The color filter layer 180 may be disposed between the encapsulation portion 200 and the counter substrate 300. The color filter layer 180 may be disposed between the encapsulation portion 200 and the counter substrate 300 to be overlapped with at least one emission area EA.

The color filter layer 180 according to an example embodiment of the present disclosure may be configured to transmit a wavelength of a color set in a subpixel SP. For example, when one pixel is composed of first to fourth subpixels SP, the color filter layer 180 may include a red color filter provided at the first subpixel, a blue color filter provided at the third subpixel, and a green color filter provided at the fourth subpixel. The second subpixel may not include a color filter layer or may include a transparent material for compensation of step difference between adjacent subpixels, whereby the second subpixel may emit white light.

The color filter layer 180 according to an example embodiment of the present disclosure may be directly formed on (or over) the upper surface of the encapsulation portion 200 and may be configured to overlap the emission area EA. For example, the color filter layer 180 may be in direct contact with the upper surface of the encapsulation portion 200. The color filter layer 180 according to another example embodiment of the present disclosure may be disposed on (or over) the inner surface of the counter substrate 300 confronting the upper surface of the encapsulation portion 200 so as to overlap the emission area EA. For example, the counter substrate 300 having the color filter layer 180 may be connected to the encapsulation portion 200 by using a transparent adhesive member.

The organic light emitting display apparatus according to another example embodiment of the present disclosure may further include a black matrix 190 disposed between each of the color filters of the color filter layer 180.

The black matrix 190 may be disposed to overlap with the remaining area except for the emission area EA of each subpixel SP. Alternatively, the remaining area except for the emission area EA of each subpixel SP may include a stacked structure of at least two color filters instead of the black matrix 190. For example, the remaining area except for the emission area EA of each subpixel SP may include a stacked structure of at least two color filters among the red color filter, the green color filter, and the blue color filter. Instead of the black matrix 190, the stacked structure of at least two color filters may prevent color mixing between the adjacent subpixels SP.

The light guide member 400 may be connected to or attached to the light extraction surface 300*a* by using an adhesive member (or first transparent adhesive member) 450. The light guide member 400 may be coupled to the light extraction surface 300*a* which is the top surface of the counter substrate 300 by using the adhesive member 450. Except that the light guide member 400 is coupled to the light extraction surface 300*a* which is the upper surface of the counter substrate 300, the light guide member 400 is the same as or substantially the same as any one of the light guide members 400 described with reference to FIGS. 7 to 13, and thus, like reference numerals refer to like elements and their repetitive descriptions may be omitted.

Therefore, the light guide member 400 may reduce or minimize the occurrence of rainbow Mura and/or circular ring pattern due to reflection of external light by diffracting and/or scattering external light incident from the outside to the light extracting portion 140 through the counter substrate 300 or re-dispersing (or re-scattering) the diffraction dispersion spectrum of the reflected light generated by the light extracting portion 140.

The organic light emitting display apparatus according to another example embodiment of the present disclosure may further include a polarizing member 500 disposed on (or over) the light guide member 400.

The polarizing member 500 may be configured to block the external light reflected by the light extracting portion 140 and the pixel circuit. For example, the polarizing member 500 may be a circular polarizing member or a circular polarizing film.

The polarizing member 500 may be disposed on or connected to the upper surface of the light guide member 400 by using a connection member (or second transparent adhesive member) 550. Accordingly, the light guide member 400 may be disposed between the light extraction surface 300*a* and the polarizing member 500.

Accordingly, the organic light emitting display apparatus or display panel according to another example embodiment of the present disclosure includes the light guide member

400 so that it is possible to improve a black color (or black rising) or a black visibility characteristic due to reflection of external light, and to minimize or reduce the occurrence of rainbow mura and circular ring mura phenomenon, thereby realizing real black in the undriven or turn-off state, and minimizing or reducing the moire phenomenon caused by the interference between the light refraction pattern and the pixel and the sparkle phenomenon according to the contrast difference caused by the light refraction pattern. Therefore, the organic light emitting display apparatus or display panel according to another example embodiment of the present disclosure may improve image quality and improve visibility of an image to a viewer.

In one or more examples, a first surface 400*a* of a light guide member 400 of FIG. 8, 11 or 13 (or the bottom surfaces 411*b* of the plurality of light refraction patterns 411 of FIG. 8, 11 or 13) may be connected to or attached to a light extraction surface (e.g., 100*a* of FIG. 3 or 300*a* of FIG. 14) by using an adhesive member 450 of FIG. 3 or 14. Thus, in these examples, the first surface 400*a* of the light guide member 400 of FIG. 8, 11 or 13 may face toward the light extraction portion 140 of FIG. 3 or 14. The bottom surfaces 411*b* of the plurality of light refraction patterns 411 of FIG. 8, 11 or 13 may face toward the light extraction portion 140 of FIG. 3 or 14. Further, the second surface 400*b* of the light guide member 400 of FIG. 8, 11 or 13 may face away from the light extraction portion 140 of FIG. 3 or 14.

In one or more other examples, a second surface 400*b* of a light guide member 400 of FIG. 8, 11 or 13 may be connected to or attached to a light extraction surface (e.g., 100*a* of FIG. 3 or 300*a* of FIG. 14) by using an adhesive member 450 of FIG. 3 or 14. Thus, in these examples, the second surface 400*b* of the light guide member 400 of FIG. 8, 11 or 13 may face toward the light extraction portion 140 of FIG. 3 or 14. The bottom surfaces 411*b* of the plurality of light refraction patterns 411 of FIG. 8, 11 or 13 may face away from the light extraction portion 140 of FIG. 3 or 14. Further, the first surface 400*a* of the light guide member 400 of FIG. 8, 11 or 13 may face away from the light extraction portion 140 of FIG. 3 or 14. Further, the −Z direction shown in FIG. 5, 8, 11 or 13 may be a +Z direction.

Figure 15A:
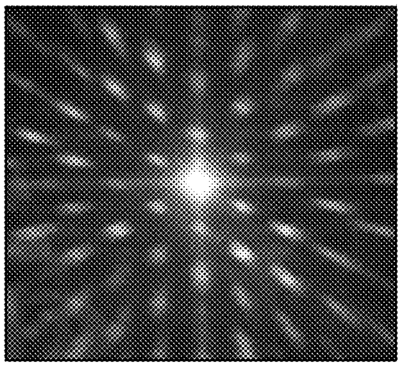
FIG. 15A is a photograph showing black visibility characteristics of the organic light emitting display apparatus according to an experimental example of the present disclosure.
Figure 15B:
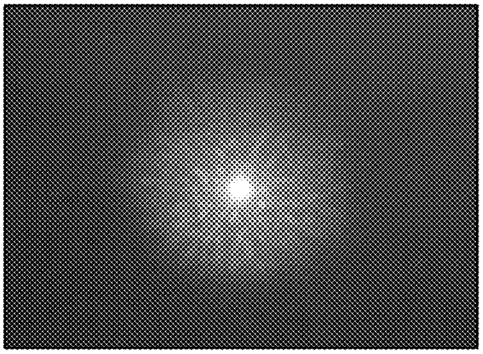
FIG. 15B is a photograph showing black visibility characteristics of the organic light emitting display apparatus according to the first example embodiment of the present disclosure.
Figure 15C:
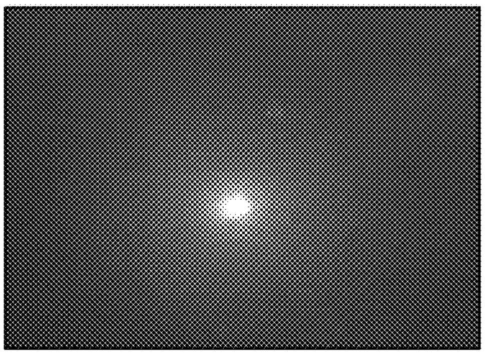
FIG. 15C is a photograph showing black visibility of the organic light emitting display apparatus according to the second example embodiment of the present disclosure.

FIG. 15A is a photograph showing black visibility characteristics of the organic light emitting display apparatus according to an experimental example of the present disclosure. FIG. 15B is a photograph showing black visibility characteristics of the organic light emitting display apparatus according to the first example embodiment of the present disclosure. FIG. 15C is a photograph showing black visibility characteristics of the organic light emitting display apparatus according to the second example embodiment of the present disclosure. In the experiment, white light is irradiated approximately at a distance of 30 cm from the organic light emitting display apparatus to photograph the black visibility characteristic. In each of FIGS. 15A to 15C, the brightest white area is generated by a wavelength having the strongest intensity of the reflected light.

The organic light emitting display apparatus according to the experimental example shown in FIG. 15A includes only a light extracting portion disposed in a planarization layer without a light guide member according to the example embodiment of the present disclosure. The organic light emitting display apparatus shown in FIG. 15B includes the light extracting portion disposed on the planarization layer and the light guide member shown in FIG. 5. The organic light emitting display apparatus shown in FIG. 15C includes the light extracting portion disposed on the planarization layer and the light guide member shown in FIG. 7.

As shown in FIG. 15A, the organic light emitting display apparatus according to the experimental example generates the rainbow Mura phenomenon in a radiation form by the reflected light reflected by the light extracting portion disposed on the planarization layer, thereby reducing a black visibility characteristic.

As shown in FIG. 15B, the organic light emitting display apparatus according to the first example embodiment of the present disclosure reduces the occurrence of rainbow Mura in a radial form by the reflected light reflected by the light extracting portion by the use of a light guide member having the structured lens pattern, thereby reducing the deterioration of a black visibility characteristic.

As shown in FIG. 15C, the organic light emitting display apparatus according to the second example embodiment of the present disclosure prevents the occurrence of rainbow Mura in a radial form by the reflected light reflected by the light extracting portion by the use of a light guide member having the atypical lens pattern, thereby greatly improving a black visibility characteristic.

Various examples and aspects of the present disclosure, including examples of a light emitting display apparatus, are described below. These are provided as examples, and do not limit the scope of the present disclosure.

An organic light emitting display apparatus according to one or more example embodiments of the present disclosure may comprise a display panel including a light extracting portion having a curved portion, and a light emitting device layer on or coupled to the light extracting portion, and a light guide member on or below a light extraction surface of the display panel. The light guide member may include a plurality of lens patterns having an atypical arrangement structure, and a refractive layer on or below the plurality of lens patterns.

According to one or more example embodiments of the present disclosure, each of the plurality of lens patterns may have a first refractive index, and the refractive layer may have a second refractive index different from the first refractive index.

According to one or more example embodiments of the present disclosure, at least some of the plurality of lens patterns may be disposed to have different diameters or different pitches.

According to one or more example embodiments of the present disclosure, each of the plurality of lens patterns may include a bottom surface and a convex surface, the bottom surfaces of at least some of the plurality of lens patterns may be configured to have different diameters, the plurality of lens patterns may include a lens pattern and another adjacent lens pattern, and the bottom surface of the lens pattern may be disposed to be connected to the bottom surface of the another adjacent lens pattern.

According to one or more example embodiments of the present disclosure, the light guide member may include a plurality of concave portions between the plurality of lens patterns, a first surface configured by a bottom surface of each of the plurality of lens patterns, and a second surface configured by the refractive layer. At least some of the plurality of concave portions may have different heights from the first surface of the light guide member.

According to one or more example embodiments of the present disclosure, each of the plurality of lens patterns may include a diameter of 1 μm to 60 μm and a height-to-diameter ratio of 20% to 50%.

According to one or more example embodiments of the present disclosure, the light guide member may include a plurality of blocks, and the plurality of lens patterns may be configured to have the same atypical arrangement structure at each of the plurality of blocks.

According to one or more example embodiments of the present disclosure, each of a horizontal length and a vertical length of each of the plurality of blocks may be greater than 87 μm and less than or equal to 800 mm.

According to one or more example embodiments of the present disclosure, the organic light emitting display apparatus may include a plurality of pixels disposed to have a pixel pitch. Each of the plurality of blocks has a size, and a ratio of the size to the pixel pitch may be two or more.

An organic light emitting display apparatus according to one or more example embodiments of the present disclosure may comprise a substrate, a plurality of subpixels having an emission area, a light extracting portion including a plurality of concave portions at the emission area, a light emitting device layer on the light extracting portion and configured to emit light to a light extraction surface, and a light guide member on or below the light extraction surface. The light guide member may include a plurality of light refraction patterns having an atypical arrangement structure, and a refractive layer on the plurality of light refraction patterns.

According to one or more example embodiments of the present disclosure, each of the plurality of light refraction patterns may have a first refractive index, and the refractive layer may have a second refractive index different from the first refractive index.

According to one or more example embodiments of the present disclosure, each of the plurality of light refraction patterns may have a diameter of 1 μm to 60 μm and a height-to-diameter ratio of 20% to 50%.

According to one or more example embodiments of the present disclosure, at least some of the plurality of light refraction patterns may be disposed to have different diameters or different pitches.

According to one or more embodiments of the present disclosure, each of the plurality of light refraction patterns may include a bottom surface and a convex surface. The bottom surface of at least some of the plurality of light refraction patterns may be configured to have a different diameter and may be disposed to be connected to the bottom surface of another adjacent light refraction pattern.

According to one or more example embodiments of the present disclosure, the light guide member may include a plurality of concave portions between the plurality of light refraction patterns, a first surface configured by a bottom surface of each of the plurality of light refraction patterns, and a second surface configured by the refractive layer. At least some of the plurality of concave portions may have different heights from the first surface of the light guide member.

According to one or more example embodiments of the present disclosure, the light guide member may include a plurality of blocks, and the plurality of light refraction patterns may be configured to have the same atypical arrangement structure at each of the plurality of blocks.

According to one or more example embodiments of the present disclosure, each of a horizontal length and a vertical length of each of the plurality of blocks may be greater than 87 μm and less than or equal to 800 mm.

According to one or more example embodiments of the present disclosure, the plurality of subpixels may configure a plurality of pixels, the plurality of pixels may be disposed to have a pixel pitch, each of the plurality of blocks has a size, and a ratio of the size to the pixel pitch may be two or more.

According to one or more example embodiments of the present disclosure, the difference in refractive index between the first refractive index and the second refractive index may be 0.05 to 0.40.

According to one or more example embodiments of the present disclosure, the substrate may be disposed between the light guide member and the light extracting portion, or the light extracting portion may be disposed between the substrate and the light guide member.

According to one or more example embodiments of the present disclosure, the organic light emitting display apparatus may further comprise one or more of a color filter layer and a polarizing member, the color filter layer may be disposed between the light extracting portion and the substrate or may be disposed between the light extracting portion and the light guide member, and the polarizing member may be coupled to the light guide member.

A light emitting display apparatus according to one or more example embodiments of the present disclosure may comprise a light extracting portion, a light emitting device layer coupled to or overlapping the light extracting portion, and a light guide member overlapping the light emitting device layer and the light extracting portion. The light guide member may be configured to diffract or scatter light from the light emitting device layer or the light extracting portion. The light guide member may include a plurality of light refraction patterns having an irregular arrangement structure, and a refractive layer on or below the plurality of light refraction patterns.

According to one or more example embodiments of the present disclosure, the light extracting portion may include one or more curved portions. An electrode of the light emitting device layer may have a surface morphology conforming to a surface morphology of the light extracting portion. The light guide member may overlap the light emitting device layer and the light extracting portion with respect to a first direction. Each of the plurality of light refraction patterns may include a convex surface. The plurality of light refraction patterns may include at least two adjacent light refraction patterns. At least portions of the convex surfaces of the at least two adjacent light refraction patterns may be combined along at least a second direction. In an example, the first direction may be a direction Z. In an example, the at least a second direction may be a direction X, a direction Y, and/or a diagonal direction between the direction X and the direction Y.

In one or more examples, a light emitting display apparatus described herein may be an organic light emitting display apparatus, and vice versa.

In one or more examples, a substrate may correspond to the substrate 100. In one or more examples, a substrate may correspond to the counter substrate 300.

The light emitting display apparatus according to one or more example embodiments of the present disclosure may be applied to or included in various electronic apparatuses. For example, the light emitting display apparatus according to one or more example embodiments of the present disclosure may be applied to or included in mobile devices, video phones, smart watches, watch phones, wearable devices, foldable devices, rollable devices, bendable devices, flexible devices, curved devices, electronic organizers, electronic books, portable multimedia players (PMPs), personal digital assistants (PDAs), motion pictures expert group audio layer 3 (MP3) players, mobile medical devices, desktop personal computers (PCs), laptop PCs, netbook computers, workstations, navigation apparatuses, automotive navigation apparatuses, automotive display apparatuses, TVs, wall paper display apparatuses, signage apparatuses, game machines, notebook computers, monitors, cameras, camcorders, and home appliances, or the like.

It will be apparent to those skilled in the art that various modifications and variations can be made in the present disclosure without departing from the technical idea, spirit or scope of the present disclosure. Thus, it is intended that the present disclosure covers the modifications and variations of this disclosure that come within the scope of the claims and their equivalents.

What is claimed is:

1. An organic light emitting display apparatus, comprising:
- a display panel including a light extracting portion having a curved portion, and a light emitting device layer on or coupled to the light extracting portion; and
- a light guide member on or below a light extraction surface of the display panel,
- wherein the light guide member includes:
- a plurality of lens patterns having an atypical arrangement structure; and
- a refractive layer on or below the plurality of lens patterns,
- wherein the light guide member includes a plurality of blocks; and
- wherein the plurality of lens patterns are configured to have the same atypical arrangement structure at each of the plurality of blocks.

2. The organic light emitting display apparatus of claim 1, wherein:
- each of the plurality of lens patterns has a first refractive index; and
- the refractive layer has a second refractive index different from the first refractive index.

3. The organic light emitting display apparatus of claim 1, wherein at least some of the plurality of lens patterns are disposed to have different diameters or different pitches.

4. The organic light emitting display apparatus of claim 1, wherein:
- each of the plurality of lens patterns includes a bottom surface and a convex surface;
- the bottom surfaces of at least some the plurality of lens patterns are configured to have different diameters;
- the plurality of lens patterns comprise a lens pattern and another adjacent lens pattern; and
- the bottom surface of the lens pattern is disposed to be connected to the bottom surface of the another adjacent lens pattern.

5. The organic light emitting display apparatus of claim 1, wherein the light guide member includes:
- a plurality of concave portions between the plurality of lens patterns;
- a first surface configured by a bottom surface of each of the plurality of lens patterns; and
- a second surface configured by the refractive layer, and
- wherein at least some of the plurality of concave portions have different heights from the first surface of the light guide member.

6. The organic light emitting display apparatus of claim 1, wherein each of the plurality of lens patterns has a diameter of 1 μm to 60 μm and a height-to-diameter ratio of 20% to 50%.

7. The organic light emitting display apparatus of claim 1, wherein each of a horizontal length and a vertical length of each of the plurality of blocks is greater than 87 μm and less than or equal to 800 mm.

8. The organic light emitting display apparatus of claim 1, comprising a plurality of pixels disposed to have a pixel pitch,
- wherein:
- each of the plurality of blocks has a size; and
- a ratio of the size to the pixel pitch is two or more.

9. An organic light emitting display apparatus, comprising:
- a substrate;
- a plurality of subpixels having an emission area;
- a light extracting portion including a plurality of concave portions at the emission area;
- a light emitting device layer on the light extracting portion and configured to emit light to a light extraction surface; and
- a light guide member on or below the light extraction surface,
- wherein the light guide member includes:
- a plurality of light refraction patterns having an atypical arrangement structure; and
- a refractive layer on or below the plurality of light refraction patterns,
- wherein the light guide member includes a plurality of blocks; and
- wherein the plurality of light refraction patterns are configured to have the same atypical arrangement structure at each of the plurality of blocks.

10. The organic light emitting display apparatus of claim 9, wherein:
- each of the plurality of light refraction patterns has a first refractive index, and
- the refractive layer has a second refractive index different from the first refractive index.

11. The organic light emitting display apparatus of claim 9, wherein each of the plurality of light refraction patterns has a diameter of 1 μm to 60 μm and a height-to-diameter ratio of 20% to 50%.

12. The organic light emitting display apparatus of claim 9, wherein at least some of the plurality of light refraction patterns are disposed to have different diameters or different pitches.

13. The organic light emitting display apparatus of claim 12, wherein:
- each of the plurality of light refraction patterns includes a bottom surface and a convex surface, and
- the bottom surface of at least some of the plurality of light refraction patterns is configured to have a different diameter and is disposed to be connected to the bottom surface of another adjacent light refraction pattern.

14. The organic light emitting display apparatus of claim 9,
- wherein the light guide member includes:
- a plurality of concave portions between the plurality of light refraction patterns;
- a first surface configured by a bottom surface of each of the plurality of light refraction patterns; and
- a second surface configured by the refractive layer,
- wherein at least some of the plurality of concave portions have different heights from the first surface of the light guide member.

15. The organic light emitting display apparatus of claim 9, wherein each of a horizontal length and a vertical length of each of the plurality of blocks is greater than 87 μm and less than or equal to 800 mm.

16. The organic light emitting display apparatus of claim 9, wherein:

the plurality of subpixels configure a plurality of pixels;

the plurality of pixels are disposed to have a pixel pitch;

each of the plurality of blocks has a size; and a ratio of the size to the pixel pitch is two or more.

17. The organic light emitting display apparatus of claim 10, wherein the difference in refractive index between the first refractive index and the second refractive index is 0.05 to 0.40.

18. The organic light emitting display apparatus of claim 9, wherein the substrate is disposed between the light guide member and the light extracting portion, or the light extracting portion is disposed between the substrate and the light guide member.

19. The organic light emitting display apparatus of claim 9, further comprising one or more of a color filter layer and a polarizing member, wherein the color filter layer is disposed between the light extracting portion and the substrate or is disposed between the light extracting portion and the light guide member, and wherein the polarizing member is coupled to the light guide member.

20. A light emitting display apparatus, comprising:

a light extracting portion;

a light emitting device layer coupled to or overlapping the light extracting portion; and a light guide member overlapping the light emitting device layer and the light extracting portion, wherein:

the light guide member is configured to diffract or scatter light from the light emitting device layer or the light extracting portion; and the light guide member includes:

a plurality of light refraction patterns having an irregular arrangement structure; and a refractive layer on or below the plurality of light refraction patterns, the light guide member includes a plurality of blocks; and the plurality of light refraction patterns are configured to have the same atypical arrangement structure at each of the plurality of blocks.

21. The light emitting display apparatus of claim 20, wherein:

the light extracting portion includes one or more curved portions;

an electrode of the light emitting device layer has a surface morphology conforming to a surface morphology of the light extracting portion;

the light guide member overlap the light emitting device layer and the light extracting portion with respect to a first direction;

each of the plurality of light refraction patterns includes a convex surface;

the plurality of light refraction patterns includes at least two adjacent light refraction patterns; and at least portions of the convex surfaces of the at least two adjacent light refraction patterns are combined along a second direction.

* * * * *